United States Patent
Shimizu et al.

(10) Patent No.: US 11,621,167 B2
(45) Date of Patent: Apr. 4, 2023

(54) SEMICONDUCTOR DEVICE, METHOD FOR MANUFACTURING SEMICONDUCTOR DEVICE, INVERTER CIRCUIT, DRIVE DEVICE, VEHICLE, AND ELEVATOR

(71) Applicant: Kabushiki Kaisha Toshiba, Minato-ku (JP)

(72) Inventors: Tatsuo Shimizu, Shinagawa (JP); Yukio Nakabayashi, Yokohama (JP); Johji Nishio, Machida (JP); Chiharu Ota, Kawasaki (JP); Toshihide Ito, Shibuya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 17/568,761

(22) Filed: Jan. 5, 2022

(65) Prior Publication Data

US 2022/0130673 A1  Apr. 28, 2022

Related U.S. Application Data

(62) Division of application No. 17/000,572, filed on Aug. 24, 2020, now Pat. No. 11,239,079.

(30) Foreign Application Priority Data

Mar. 19, 2020  (JP) .............................. JP2020-049317

(51) Int. Cl.
*H01L 21/04* (2006.01)
*H01L 29/06* (2006.01)
(Continued)

(52) U.S. Cl.
CPC ........ *H01L 21/045* (2013.01); *H01L 21/0217* (2013.01); *H01L 21/02164* (2013.01);
(Continued)

(58) Field of Classification Search
None
See application file for complete search history.

(56) References Cited

U.S. PATENT DOCUMENTS 8,525,187 B2  9/2013  Harada et al.
8,536,583 B2  9/2013  Wada et al.
(Continued)

FOREIGN PATENT DOCUMENTS

JP  2012-164788 A  8/2012
JP  2015-060905 A  3/2015
(Continued)

*Primary Examiner* — Jack S Chen
(74) *Attorney, Agent, or Firm* — Oblon, McClelland, Maier & Neustadt, L.L.P.

(57) ABSTRACT

A semiconductor device according to an embodiment includes: a silicon carbide layer; a silicon oxide layer; and a region disposed between the silicon carbide layer and the silicon oxide layer and having a nitrogen concentration equal to or more than $1\times10^{21}$ cm$^{-3}$. A nitrogen concentration distribution in the silicon carbide layer, the silicon oxide layer, and the region have a peak in the region, a nitrogen concentration at a first position 1 nm away from the peak to the side of the silicon oxide layer is equal to or less than $1\times10^{18}$ cm$^{-3}$ and a carbon concentration at the first position is equal to or less than $1\times10^{18}$ cm$^{-3}$, and a nitrogen concentration at a second position 1 nm away from the peak to the side of the silicon carbide layer is equal to or less than $1\times10^{18}$ cm$^{-3}$.

5 Claims, 19 Drawing Sheets

(51) Int. Cl.
- *H01L 29/10* (2006.01)
- *H01L 29/51* (2006.01)
- *H01L 29/78* (2006.01)
- *H01L 21/02* (2006.01)
- *H01L 29/66* (2006.01)
- *H01L 29/16* (2006.01)
- *H02P 27/06* (2006.01)
- *B61C 3/00* (2006.01)
- *B60L 50/51* (2019.01)
- *B66B 11/04* (2006.01)

(52) U.S. Cl.
CPC .. *H01L 21/02236* (2013.01); *H01L 21/02271* (2013.01); *H01L 21/046* (2013.01); *H01L 21/049* (2013.01); *H01L 29/0623* (2013.01); *H01L 29/1095* (2013.01); *H01L 29/1608* (2013.01); *H01L 29/51* (2013.01); *H01L 29/66068* (2013.01); *H01L 29/7802* (2013.01); *H01L 29/7811* (2013.01); *H01L 29/7813* (2013.01); *B60L 50/51* (2019.02); *B60L 2210/42* (2013.01); *B61C 3/00* (2013.01); *B66B 11/043* (2013.01); *H02P 27/06* (2013.01)

(56) References Cited

U.S. PATENT DOCUMENTS

| | | | |
|---|---|---|---|
| 9,324,826 | B2 | 4/2016 | Shimizu et al. |
| 2016/0197150 | A1 | 7/2016 | Ariyoshi et al. |
| 2019/0267451 | A1 | 8/2019 | Araoka et al. |
| 2021/0083062 | A1 | 3/2021 | Shimizu |
| 2021/0296128 | A1 | 9/2021 | Shimizu |
| 2021/0296446 | A1 | 9/2021 | Shimizu |
| 2022/0005925 | A1* | 1/2022 | Shimizu ................ H01L 29/518 |
| 2022/0302250 | A1* | 9/2022 | Shimizu ................ H01L 29/167 |
| 2022/0302261 | A1* | 9/2022 | Shimizu ............ H01L 29/66053 |

FOREIGN PATENT DOCUMENTS

| | | |
|---|---|---|
| JP | 5763154 B2 | 8/2015 |
| JP | 2019-149527 A | 9/2019 |
| JP | 2021-48198 A | 3/2021 |
| WO | WO 2010/110252 A1 | 9/2010 |
| WO | WO 2010/116886 A1 | 10/2010 |

* cited by examiner

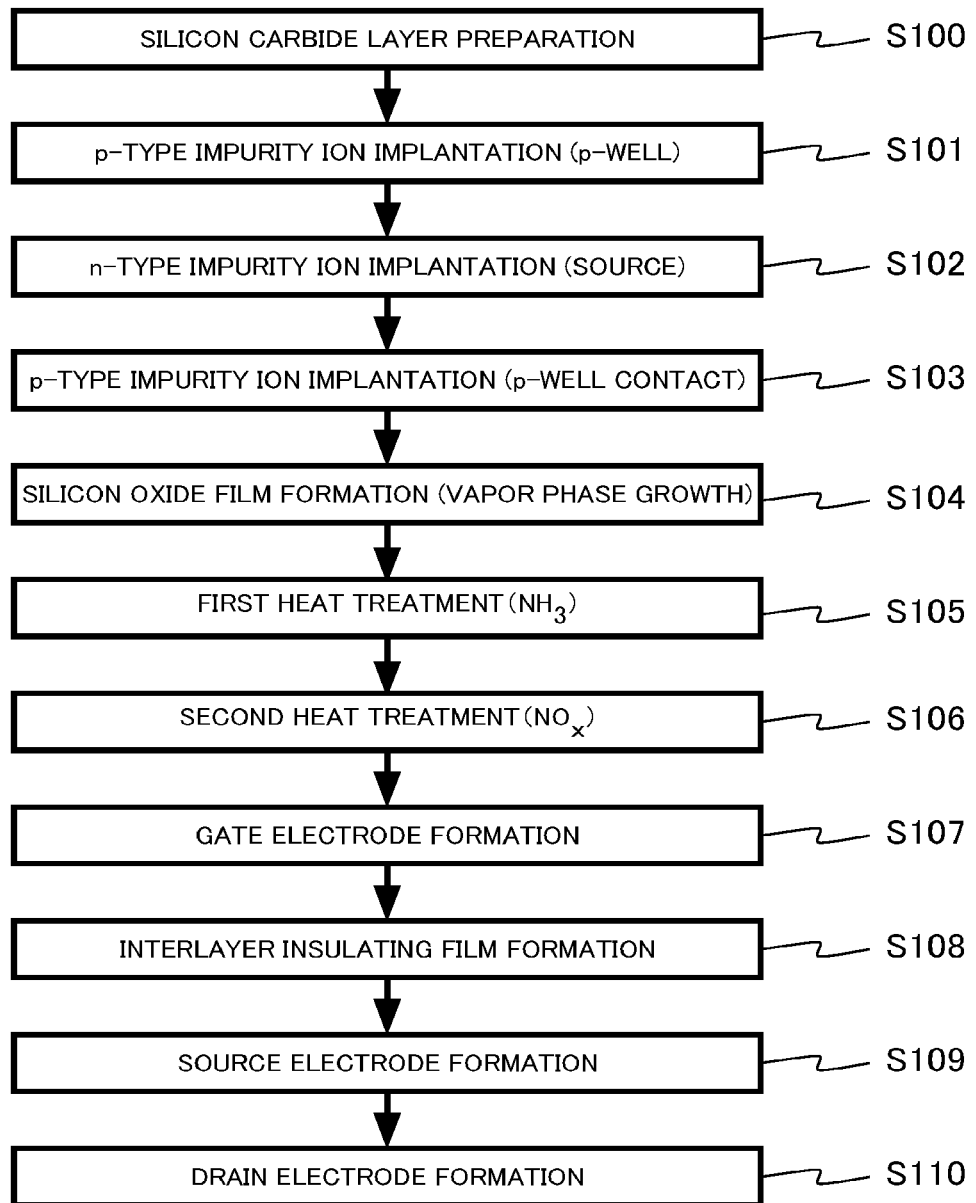

SEMICONDUCTOR DEVICE, METHOD FOR MANUFACTURING SEMICONDUCTOR DEVICE, INVERTER CIRCUIT, DRIVE DEVICE, VEHICLE, AND ELEVATOR

CROSS-REFERENCE TO RELATED APPLICATION

This application is a division of and claims the benefit of priority under 35 U.S.C. § 120 from U.S. application Ser. No. 17/000,572 filed Aug. 24, 2020, and claims the benefit of priority under 35 U.S.C. § 119 from Japanese Patent Application No. 2020-049317 filed Mar. 19, 2020, the entire contents of each of which are incorporated herein by reference.

FIELD

Embodiments described herein relate generally to a semiconductor device, a method for manufacturing a semiconductor device, an inverter circuit, a drive device, a vehicle, and an elevator.

BACKGROUND

Silicon carbide (SiC) is expected as a material for next-generation semiconductor devices. As compared with silicon (Si), silicon carbide has superior physical properties such as a threefold band gap, approximately tenfold breakdown field strength, and approximately threefold thermal conductivity. By using these characteristics, a semiconductor device in which low loss and high-temperature operation can be implemented can be realized.

However, for example, when a metal oxide semiconductor field effect transistor (MOSFET) is formed using silicon carbide, there is a problem that carrier mobility decreases or a threshold voltage changes. One of factors causing the decrease in the carrier mobility or the change in the threshold voltage is considered to be carbon defects or nitrogen defects existing in a gate insulating layer.

BRIEF DESCRIPTION OF THE DRAWINGS

FIG. 5 is a process flow diagram of a method for manufacturing the semiconductor device according to the first embodiment;

DETAILED DESCRIPTION

Figure 1:
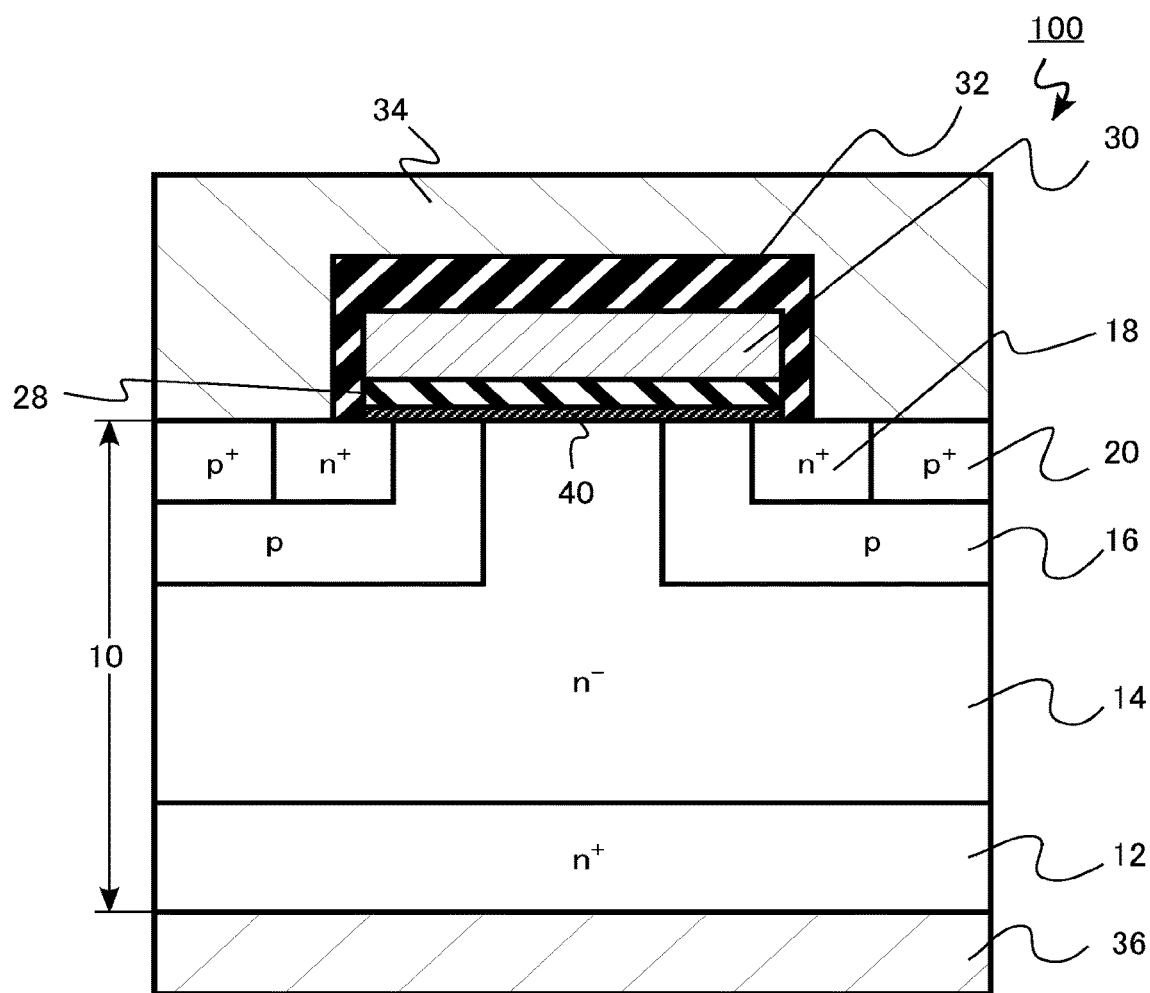
FIG. 1 is a schematic cross-sectional view of a semiconductor device according to a first embodiment.

A semiconductor device according to an embodiment includes: a silicon carbide layer; a silicon oxide layer; and a region disposed between the silicon carbide layer and the silicon oxide layer and having a nitrogen concentration equal to or more than $1 \times 10^{21}$ cm$^{-3}$. A nitrogen concentration distribution in the silicon carbide layer, the silicon oxide layer, and the region have a peak in the region, a nitrogen concentration at a first position 1 nm away from the peak to the side of the silicon oxide layer is equal to or less than $1 \times 10^{18}$ cm$^{-3}$ and a carbon concentration at the first position is equal to or less than $1 \times 10^{18}$ cm$^{-3}$, and a nitrogen concentration at a second position 1 nm away from the peak to the side of the silicon carbide layer is equal to or less than $1 \times 10^{10}$ cm$^{-3}$.

Hereinafter, embodiments of the present disclosure will be described with reference to the drawings. In the following description, the same or similar members are denoted by the same reference numerals and the description of the members described once is appropriately omitted.

In addition, in the following description, notations n$^+$, n, n$^-$, p$^+$, p, and p$^-$ represent the relative magnitudes of impurity concentrations in respective conductive types. That is, an n-type impurity concentration of n$^+$ is relatively higher than an n-type impurity concentration of n and an n-type impurity concentration of n$^-$ is relatively lower than the n-type impurity concentration of n. In addition, a p-type impurity concentration of p$^+$ is relatively higher than a p-type impurity concentration of p and a p-type impurity concentration of p$^-$ is relatively lower than the p-type impurity concentration of p. The n$^+$ type and the n$^-$ type may be simply described as the n types and the p$^+$ type and the p$^-$ type may be simply described as the p types. An impurity concentration of each region is represented by, for example, a value of an impurity concentration of a center portion of each region, unless otherwise specified.

The impurity concentration can be measured by secondary ion mass spectrometry (SIMS), for example. In addition, the relative magnitude of the impurity concentration can be determined from the magnitude of a carrier concentration obtained by scanning capacitance microscopy (SCM), for example. In addition, a distance such as a width and a depth of an impurity region can be obtained by SIMS, for example. In addition, the distance such as the width and the depth of the impurity region can be obtained from an SCM image, for example.

A depth of a trench, a thickness of an insulating layer, and the like can be measured on an SIMS or transmission electron microscope (TEM) image, for example.

Bonding states of silicon atoms, carbon atoms, nitrogen atoms, and oxygen atoms in a silicon carbide layer can be identified by using, for example, X-ray photoelectron spectroscopy (XPS method). Further, concentrations of various bonding states and a magnitude relation of the concentrations can be determined by using, for example, X-ray photoelectron spectroscopy (XPS method).

First Embodiment

A semiconductor device according to a first embodiment includes: a silicon carbide layer; a silicon oxide layer; and a region disposed between the silicon carbide layer and the silicon oxide layer and having a nitrogen concentration equal to or more than $1\times10^{21}$ cm$^{-3}$. A nitrogen concentration distributions in the silicon carbide layer, the silicon oxide layer, and the region have a peak in the region, a nitrogen concentration at a first position 1 nm away from the peak to the side of the silicon oxide layer is equal to or less than $1\times10^{18}$ cm$^{-3}$ and a carbon concentration at the first position is equal to or less than $1\times10^{18}$ cm$^{-3}$, and a nitrogen concentration at a second position 1 nm away from the peak to the side of the silicon carbide layer is equal to or less than $1\times10^{18}$ cm$^{-3}$.

FIG. 1 is a schematic cross-sectional view of the semiconductor device according to the first embodiment. The semiconductor device is a MOSFET 100. The MOSFET 100 is a double implantation MOSFET (DIMOSFET) in which a p-well and a source region are formed by ion implantation. Further, the MOSFET 100 is an n-channel MOSFET using electrons as carriers.

The MOSFET 100 includes a silicon carbide layer 10, a gate insulating layer 28 (silicon oxide layer), a gate electrode 30, an interlayer insulating film 32, a source electrode 34, a drain electrode 36, and an interface termination region 40 (region).

The silicon carbide layer 10 includes a drain region 12, a drift region 14, a p-well region 16, a source region 18, and a p-well contact region 20.

The silicon carbide layer 10 is, for example, single crystal of 4H—SiC. The silicon carbide layer 10 is disposed between the source electrode 34 and the drain electrode 36.

Figure 2:
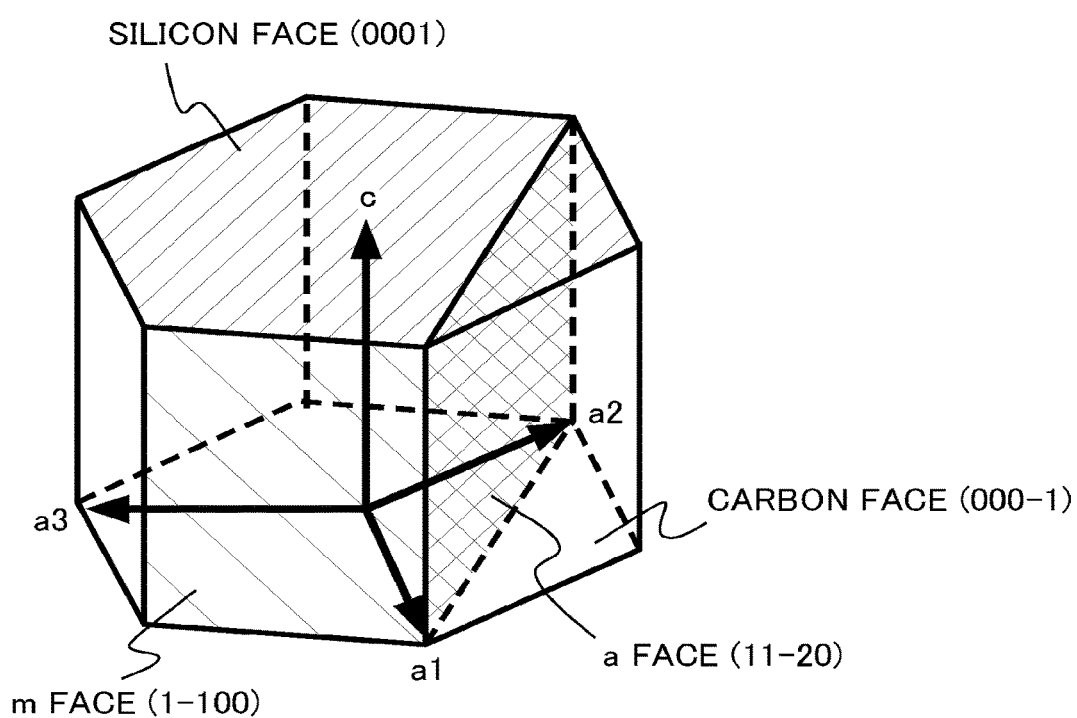
FIG. 2 is a diagram showing a crystal structure of a SiC semiconductor.

FIG. 2 is a diagram showing a crystal structure of a SiC semiconductor. A typical crystal structure of the SiC semiconductor is a hexagonal crystal system such as 4H—SiC. One of faces (top faces of a hexagonal column) with a c-axis along an axial direction of the hexagonal column as a normal is a (0001) face. A face equivalent to the (0001) face is referred to as a silicon face (Si face) and expressed as a {0001} face. Silicon atoms (Si) are arranged on an outermost face of the silicon face.

The other of the faces (top faces of the hexagonal column) with the c-axis along the axial direction of the hexagonal column as the normal is a (000-1) face. A face equivalent to the (000-1) face is referred to as a carbon face (C face) and expressed as a {000-1} face. Carbon atoms (C) are arranged on an outermost face of the carbon face.

On the other hand, a side face (column face) of the hexagonal column is an m face to be a face equivalent to a (1-100) face, that is, a {1-100} face. Further, a face passing through a pair of ridge lines not adjacent to each other is an a face to be a face equivalent to a (11-20) face, that is, a {11-20} face. Both the silicon atoms (Si) and the carbon atoms (C) are arranged on outermost faces of the m face and the a face.

Hereinafter, a case where a surface of the silicon carbide layer 10 is a surface inclined by an angle equal to or more than 0 degrees and equal to or less than 8 degrees with respect to the silicon face and a back surface is a face inclined by an angle equal to or more than 0 degrees and equal to or less than 8 degrees with respect to the carbon face will be described as an example. The surface of the silicon carbide layer 10 has an off angle equal to or more than 0 degrees and equal to or less than 8 degrees with respect to the silicon face.

The drain region 12 is n$^+$-type SiC. The drain region 12 includes nitrogen (N) as n-type impurities, for example. An n-type impurity concentration of the drain region 12 is, for example, equal to or more than $1\times10^{18}$ cm$^{-3}$ and equal to or less than $1\times10^{21}$ cm$^{-3}$.

The drift region 14 is provided on the drain region 12. The drift region 14 is n$^-$-type SiC. The drift region 14 includes nitrogen as n-type impurities, for example.

An n-type impurity concentration of the drift region 14 is lower than the n-type impurity concentration of the drain region 12. The n-type impurity concentration of the drift region 14 is, for example, equal to or more than $1\times10^{15}$ cm$^{-3}$ and equal to or less than $2\times10^{16}$ cm$^{-3}$. The drift region 14 is, for example, an SiC epitaxial growth layer formed on the drain region 12 by epitaxial growth.

A thickness of the drift region 14 is, for example, equal to or more than 5 μm and equal to or less than 100 μm.

The p-well region 16 is provided on a partial surface of the drift region 14. The p-well region 16 is p-type SiC. The p-well region 16 includes aluminum (Al) as p-type impurities, for example. A p-type impurity concentration of the p-well region 16 is, for example, equal to or more than $1\times10^{16}$ cm$^{-3}$ and equal to or less than $1\times10^{20}$ cm$^{-3}$.

A depth of the p-well region 16 is, for example, equal to or more than 0.4 μm and equal to or less than 0.8 μm. The p-well region 16 functions as a channel region of the MOSFET 100.

The source region 18 is provided on a partial surface of the p-well region 16. The source region 18 is n$^+$-type SiC. The source region 18 includes phosphorus (P) as n-type impurities, for example. An n-type impurity concentration of the source region 18 is, for example, equal to or more than $1\times10^{18}$ cm$^{-3}$ and equal to or less than $1\times10^{22}$ cm$^{-3}$.

A depth of the source region 18 is shallower than the depth of the p-well region 16. The depth of the source region 18 is, for example, equal to or more than 0.2 μm and equal to or less than 0.4 μm.

The p-well contact region 20 is provided on a partial surface of the p-well region 16. The p-well contact region 20 is provided on the side of the source region 18. The p-well contact region 20 is p$^+$-type SiC.

The p-well contact region 20 includes aluminum as p-type impurities, for example. A p-type impurity concentration of the p-well contact region 20 is, for example, equal to or more than $1\times10^{18}$ cm$^{-3}$ and equal to or less than $1\times10^{22}$ cm$^{-3}$.

A depth of the p-well contact region 20 is shallower than the depth of the p-well region 16. The depth of the p-well contact region 20 is, for example, equal to or more than 0.2 µm and equal to or less than 0.4 µm.

The gate insulating layer 28 is provided between the silicon carbide layer 10 and the gate electrode 30. The gate insulating layer 28 is provided between the drift region 14 and the p-well region 16 and the gate electrode 30. The gate insulating layer 28 is provided on the drift region 14 and the p-well region 16. The gate insulating layer 28 is continuously formed on the surfaces of the drift region 14 and the p-well region 16.

The gate insulating layer 28 is, for example, silicon oxide. The gate insulating layer 28 is an example of a silicon oxide layer.

A thickness of the gate insulating layer 28 is, for example, equal to or more than 30 nm and equal to or less than 100 nm. The gate insulating layer 28 functions as a gate insulating layer of the MOSFET 100. The thickness of the gate insulating layer 28 is, for example, equal to or more than 40 nm and equal to or less than 50 nm.

The interface termination region 40 is disposed between the silicon carbide layer 10 and the gate insulating layer 28. The interface termination region 40 is disposed between the drift region 14 and the p-well region 16 and the gate insulating layer 28. The interface termination region 40 includes nitrogen (N) as a termination element terminating a dangling bond of the silicon carbide layer 10. The interface termination region 40 is an example of a region.

A nitrogen concentration of the interface termination region 40 is equal to or more than $1\times10^{21}$ cm$^{-3}$.

Figure 3:
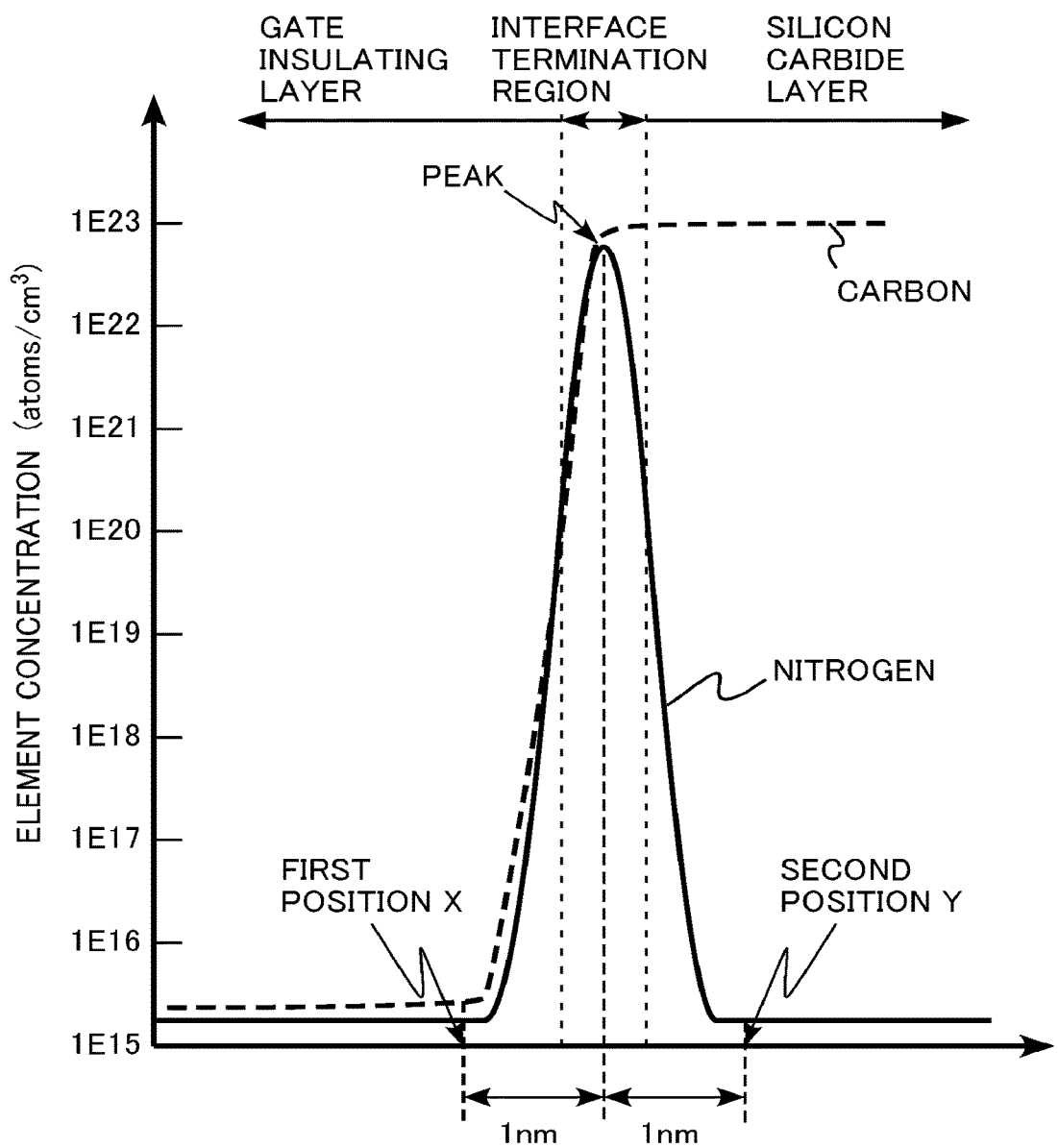
FIG. 3 is a diagram showing an element concentration distribution of the semiconductor device according to the first embodiment.

FIG. 3 is a diagram showing an element concentration distribution of the semiconductor device according to the first embodiment. FIG. 3 is a diagram showing element concentration distributions in the gate insulating layer 28, the interface termination region 40, and the silicon carbide layer 10. FIG. 3 shows concentration distributions of nitrogen and carbon.

The nitrogen concentration distribution has a peak in the interface termination region 40. A nitrogen concentration at the peak is, for example, equal to or more than $1\times10^{22}$ cm$^{-3}$. A full width at half maximum with respect to the peak of the nitrogen concentration distribution is, for example, equal to or less than 1 nm. Nitrogen is segregated at an interface between the silicon carbide layer 10 and the gate insulating layer 28.

A nitrogen concentration at the peak of the nitrogen concentration distribution is, for example, equal to or more than $4\times10^{19}$ cm$^{-3}$ and equal to or less than $4\times10^{23}$ cm$^{-3}$. In order to ensure the termination, the nitrogen concentration at the peak is preferably equal to or more than $1\times10^{21}$ cm$^{-3}$. The nitrogen concentration at the peak is more preferably equal to or more than $1\times10^{22}$ cm$^{-3}$. On the other hand, if there is excess nitrogen, this causes charge trapping, so that the nitrogen concentration at the peak is preferably equal to or less than $1\times10^{23}$ cm$^{-3}$. Typically, the nitrogen concentration at the peak is about $5.0\times10^1$, cm$^{-3}$, that is, $5.0\times10^{11}$ cm$^{-3}\pm5\%$. When the nitrogen concentration at the peak is in the above range, good characteristics in which there is no charge trapping may be exhibited. A nitrogen area density at the interface is preferably equal to or more than $1\times10^{14}$ cm$^{-2}$ and equal to or less than $2.5\times10^{15}$ cm$^{-2}$. Typically, the nitrogen area density is about $1.4\times10^{15}$ cm$^{-2}$, that is, $1.4\times10^{15}$ cm$^{-2}\pm5\%$. When the nitrogen area density is in the above range, good characteristics in which there is no charge trapping are exhibited.

The nitrogen concentration at a first position X to be 1 nm away from the peak of the nitrogen concentration distribution to the side of the gate insulating layer 28 is equal to or less than $1\times10^{18}$ cm$^{-3}$. Further, the nitrogen concentration at a second position Y to be 1 nm away from the peak of the nitrogen concentration distribution to the side of the silicon carbide layer 10 is equal to or less than $1\times10^{18}$ cm$^{-3}$.

Figure 4A:
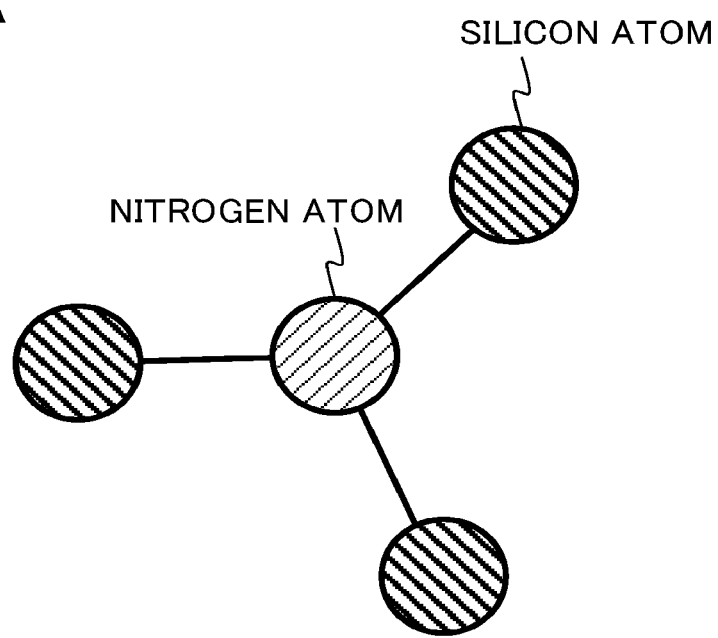
FIGS. 4A and 4B are schematic views showing a bonding state of nitrogen atoms in the semiconductor device according to the first embodiment.
Figure 4B:
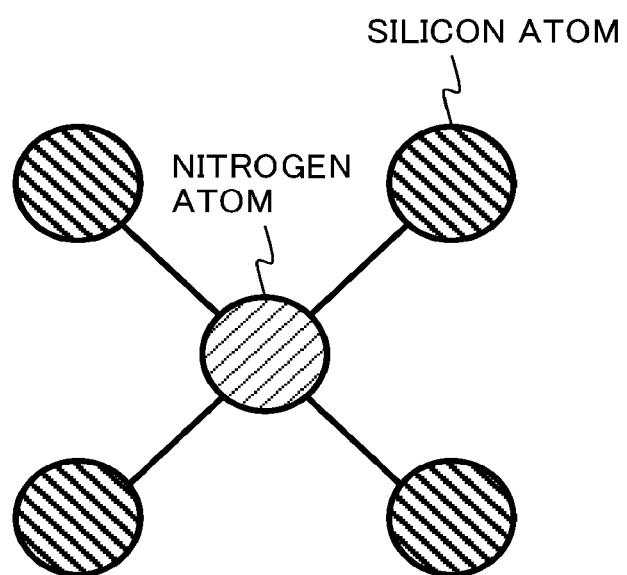

FIGS. 4A and 4B are schematic views showing a bonding state of nitrogen atoms in the semiconductor device according to the first embodiment. FIG. 4A shows a case where the nitrogen atom is tri-coordinated and FIG. 4B shows a case where the nitrogen atom is tetra-coordinated.

In the case of the tri-coordination shown in FIG. 4A, the nitrogen atom is bonded to three silicon atoms. In the case of the tetra-coordination shown in FIG. 4B, the nitrogen atom is bonded to four silicon atoms.

In the interface termination region 40, an amount of nitrogen atoms bonded to the three silicon atoms is larger than an amount of nitrogen atoms bonded to the four silicon atoms. In other words, in the interface termination region 40, the amount of tri-coordinated nitrogen atoms is larger than the amount of tetra-coordinated nitrogen atoms.

For example, 90% or more of the nitrogen atoms present in the interface termination region 40 are the tri-coordinated nitrogen atoms. A concentration of the tri-coordinated nitrogen atom is, for example, equal to or more than $1\times10^{22}$ cm$^{-3}$.

The tri-coordinated nitrogen atoms present in the interface termination region 40 terminate the dangling bond on the surface of the silicon carbide layer 10.

Nitrogen substitutes carbon atoms of a bilayer configuring an uppermost layer of the silicon carbide layer 10. Excess silicon atoms or carbon atoms are emitted to the side of the gate insulating layer 28. And the termination element is finally bonded to the silicon carbide layer 10 in a tri-coordination manner. Nitrogen is at the positions of the carbon atoms in the crystal structure of silicon carbide. A part of the outermost silicon is absorbed into the side of the gate insulating layer 28, and nitrogen is tri-coordinated with the silicon atoms of the silicon carbide layer 10.

The nitrogen atoms present in a bulk of the silicon carbide layer 10 and substituting carbon sites of a crystal structure of silicon carbide are tetra-coordinated. Since the tetra-coordinated nitrogen serves as an n-type dopant, the tetra-coordinated nitrogen decreases a threshold voltage.

A concentration of the nitrogen atom bonded to the four silicon atoms at the second position Y is equal to or less than $1\times10^{18}$ cm$^{-3}$. In other words, the concentration of the tetra-coordinated nitrogen atom at the second position Y is equal to or less than $1\times10^{18}$ cm$^{-3}$.

The carbon concentration distribution decreases from the interface termination region 40 toward the gate insulating layer 28. The carbon concentration at the first position X is equal to or less than $1\times10^{18}$ cm$^{-3}$.

A concentration at the position X of a complex including the carbon atoms bonded to the oxygen atoms and the nitrogen atoms bonded to the oxygen atoms is, for example, equal to or less than $1\times10^{18}$ cm$^{-3}$.

The gate electrode 30 is provided on the gate insulating layer 28. The gate electrode 30 sandwiches the gate insulating layer 28 with the silicon carbide layer 10. The gate electrode 30 sandwiches the gate insulating layer 28 with the drift region 14. The gate electrode 30 sandwiches the gate insulating layer 28 with the p-well region 16.

The gate electrode 30 is, for example, polycrystalline silicon including n-type impurities or p-type impurities.

The interlayer insulating film 32 is formed on the gate electrode 30. The interlayer insulating film 32 is, for example, a silicon oxide film.

The source electrode 34 is electrically connected to the source region 18 and the p-well contact region 20. The source electrode 34 also functions as a p-well electrode for applying an electric potential to the p-well region 16.

The source electrode 34 is formed of, for example, a stacked layer of a barrier metal layer of nickel (Ni) and a metal layer of aluminum on the barrier metal layer. The barrier metal layer of nickel and the silicon carbide layer may react to form nickel silicide (NiSi, $Ni_2Si$, or the like). The barrier metal layer of nickel and the metal layer of aluminum may form an alloy by reaction.

The drain electrode 36 is provided on the side of the silicon carbide layer 10 opposite to the source electrode 34, that is, the back side. The drain electrode 36 is, for example, nickel. Nickel may react with the drain region 12 to form nickel silicide (NiSi, $Ni_2Si$, or the like).

In the first embodiment, the n-type impurity is, for example, nitrogen or phosphorus. Arsenic (As) or antimony (Sb) can also be applied as the n-type impurity.

Further, in the first embodiment, the p-type impurity is, for example, aluminum. Boron (B), gallium (Ga), and indium (In) can also be applied as the p-type impurity.

Next, an example of a method for manufacturing the semiconductor device according to the first embodiment will be described.

A method for manufacturing the semiconductor device according to the first embodiment includes: forming a silicon oxide film on a silicon carbide layer; performing first heat treatment at a temperature equal to or more than 1200° C. and equal to or less than 1600° C., under at least one atmosphere selected from the group consisting of a first atmosphere including ammonia gas, a second atmosphere including nitrogen gas and hydrogen gas, and a third atmosphere including nitrogen gas and carbon dioxide gas, after the forming the silicon oxide film; and performing second heat treatment at a temperature equal to or more than 750° C. and equal to or less than 1050° C., under an atmosphere including nitrogen oxide gas, after the first heat treatment.

Hereinafter, a case where the first heat treatment is performed in a first atmosphere including ammonia gas ($NH_3$) will be described as an example.

FIG. 5 is a process flow diagram of the method for manufacturing the semiconductor device according to the first embodiment.

As shown in FIG. 5, the method for manufacturing the semiconductor device according to the first embodiment includes silicon carbide layer preparation (step S100), p-type impurity ion implantation (step S101), n-type impurity ion implantation (step S102), p-type impurity ion implantation (step S103), silicon oxide film formation (step S104), first heat treatment (step S105), second heat treatment (step S106), gate electrode formation (step S107), interlayer insulating film formation (step S108), source electrode formation (step S109), and drain electrode formation (step S110).

In step S100, the silicon carbide layer 10 is prepared. The silicon carbide layer 10 includes the $n^+$-type drain region 12 and the $n^-$-type drift region 14. The drift region 14 is formed on the drain region 12 by an epitaxial growth method, for example.

The drain region 12 includes nitrogen as n-type impurities. An n-type impurity concentration of the drain region 12 is, for example, equal to or more than $1\times10^{18}$ $cm^{-3}$ and equal to or less than $1\times10^{21}$ $cm^{-3}$.

The drift region 14 includes nitrogen as n-type impurities. The n-type impurity concentration of the drift region 14 is, for example, equal to or more than $1\times10^{15}$ $cm^{-3}$ and equal to or less than $2\times10^{16}$ $cm^{-3}$. A thickness of the drift region 14 is, for example, equal to or more than 5 μm and equal to or less than 100 μm.

In step S101, first, a first mask material is formed by patterning using photolithography and etching. Then, by using the first mask material as an ion implantation mask, aluminum to be p-type impurities is ion-implanted into the drift region 14. The p-well region 16 is formed by ion implantation.

In step S102, first, a second mask material is formed by patterning using photolithography and etching. Then, by using the second mask material as an ion implantation mask, phosphorus to be n-type impurities is ion-implanted into the drift region 14 to form the source region 18.

In step S103, a third mask material is formed by patterning using photolithography and etching. By using the third mask material as an ion implantation mask, aluminum to be p-type impurities is ion-implanted into the drift region 14 to form the p-well contact region 20.

In step S104, a silicon oxide film is formed on the silicon carbide layer 10. The silicon oxide film finally becomes the gate insulating layer 28.

The silicon oxide film is formed by, for example, vapor phase growth. The silicon oxide film is formed by, for example, a chemical vapor deposition method (CVD method) or a physical vapor deposition method (PVD method). The silicon oxide film is a deposited film. The thickness of the silicon oxide film is, for example, equal to or more than 30 nm and equal to or less than 100 nm. The thickness of the silicon oxide film is, for example, equal to or more than 40 nm and equal to or less than 50 nm.

The silicon oxide film is, for example, a silicon oxide film formed by the CVD method using tetraethyl orthosilicate (TEOS) as source gas. Further, the silicon oxide film is, for example, a silicon oxide film formed by the CVD method using dichlorosilane gas ($SiH_2Cl_2$) and dinitrogen monoxide gas ($N_2O$) as source gases.

In step S105, first heat treatment is performed. The first heat treatment is performed in an atmosphere including ammonia gas ($NH_3$).

For example, the heat treatment is performed by supplying the ammonia gas ($NH_3$) to a reaction furnace containing the silicon carbide layer 10.

A temperature of the first heat treatment is, for example, equal to or more than 1200° C. and equal to or less than 1600° C.

A partial pressure of the ammonia gas in the atmosphere of the first heat treatment is, for example, equal to or more than 90%.

By the first heat treatment, the interface termination region 40 is formed at the interface between the silicon carbide layer 10 and the silicon oxide film.

The first heat treatment also functions as densification annealing of the silicon oxide film. By the first heat treatment, the silicon oxide film becomes a high-density film.

In step S106, the second heat treatment is performed. The second heat treatment is performed in an atmosphere including nitrogen oxide gas (NOx). The nitrogen oxide gas is, for example, nitric monoxide gas (NO). Further, the nitrogen oxide gas is, for example, dinitrogen monoxide gas ($N_2O$).

For example, the heat treatment is performed by supplying the nitrogen oxide gas (NOx) to the reaction furnace containing the silicon carbide layer 10.

A temperature of the second heat treatment is, for example, equal to or more than 750° C. and equal to or less than 1050° C. The temperature of the second heat treatment is lower than the temperature of the first heat treatment.

A partial pressure of the nitrogen oxide gas in the atmosphere of the second heat treatment is, for example, equal to or more than 10%.

By the second heat treatment, nitrogen in the silicon oxide film is removed. By the second heat treatment, a silicon oxide film with reduced nitrogen defects is formed.

In step S107, the gate electrode 30 is formed on the gate insulating layer 28. The gate electrode 30 is, for example, polycrystalline silicon including n-type impurities or p-type impurities.

In step S108, the interlayer insulating film 32 is formed on the gate electrode 30. The interlayer insulating film 32 is, for example, a silicon oxide film.

In step S109, the source electrode 34 is formed. The source electrode 34 is formed on the source region 18 and the p-well contact region 20. The source electrode 34 is formed by sputtering of nickel (Ni) and aluminum (Al), for example.

In step S110, the drain electrode 36 is formed. The drain electrode 36 is formed on the back side of the silicon carbide layer 10. The drain electrode 36 is formed by sputtering of nickel, for example.

The MOSFET 100 shown in FIG. 1 is formed by the above manufacturing method.

Next, functions and effects of the semiconductor device and the method for manufacturing the semiconductor device according to the first embodiment will be described.

When the MOSFET is formed using silicon carbide, there is a problem that carrier mobility decreases. One of factors causing the decrease in the carrier mobility is considered to be an interface state between the silicon carbide layer and the gate insulating layer. It is considered that the interface state is caused by the dangling bond existing on the surface of the silicon carbide layer.

The MOSFET 100 according to the first embodiment includes the interface termination region 40 in which nitrogen is segregated between the silicon carbide layer 10 and the gate insulating layer 28. By the interface termination region 40, the dangling bond is reduced. Therefore, a MOSFET in which the decrease in the carrier mobility is suppressed is realized.

Further, when the MOSFET is formed using silicon carbide, there is a problem that the carrier mobility decreases or a threshold voltage changes. Further, there is a problem that a leakage current of the gate insulating layer increases or reliability of the gate insulating layer decreases. One of factors causing the above problems is considered to be the carbon defects or the nitrogen defects existing in the gate insulating layer.

The carbon defects or the nitrogen defects are considered to be the factor causing the above problems by forming trap levels in the gate insulating layer.

In the MOSFET 100 according to the first embodiment, the amounts of carbon defects and nitrogen defects in the gate insulating layer 28 are reduced. Therefore, the decrease in the carrier mobility, the change in the threshold voltage, the increase in the leakage current of the gate insulating layer, or the decrease in the reliability of the gate insulating layer due to the carbon defects or the nitrogen defects is suppressed. The details will be described below.

There are various forms in the carbon defects. The carbon defects are, for example, a double bond between carbon atoms, tri-coordination carbon in which three silicon atoms are coordinated, a structure in which oxygen atoms are double-bonded to carbon atoms, and the like. It has been clarified by the first principle calculation by the inventors that these carbon defects form trap levels due to Pz orbitals.

These carbon defects are formed by the introduction of carbon atoms into oxygen sites of silicon oxide.

There are various forms in the nitrogen defects.

Figure 6A:
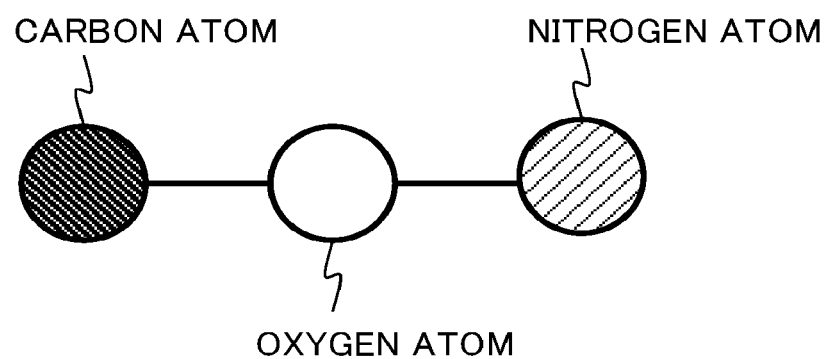
FIGS. 6A and 6B are diagrams illustrating nitrogen defects.
Figure 6B:
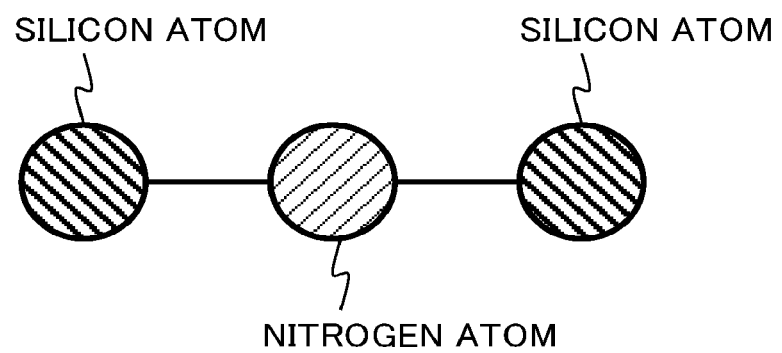

FIGS. 6A and 6B are diagrams illustrating the nitrogen defects. FIG. 6A shows a complex including a carbon atom bonded to an oxygen atom and a nitrogen atom bonded to the oxygen atom. FIG. 6A shows a C—O—N bond. The carbon atom and the nitrogen atom of the C—O—N bond are introduced into the silicon sites of silicon oxide.

FIG. 6B shows a nitrogen defect including a structure in which a nitrogen atom is bonded to at least two silicon atoms. In the nitrogen defect of FIG. 6B, the nitrogen atom is introduced into the oxygen site of silicon oxide.

Figure 7:
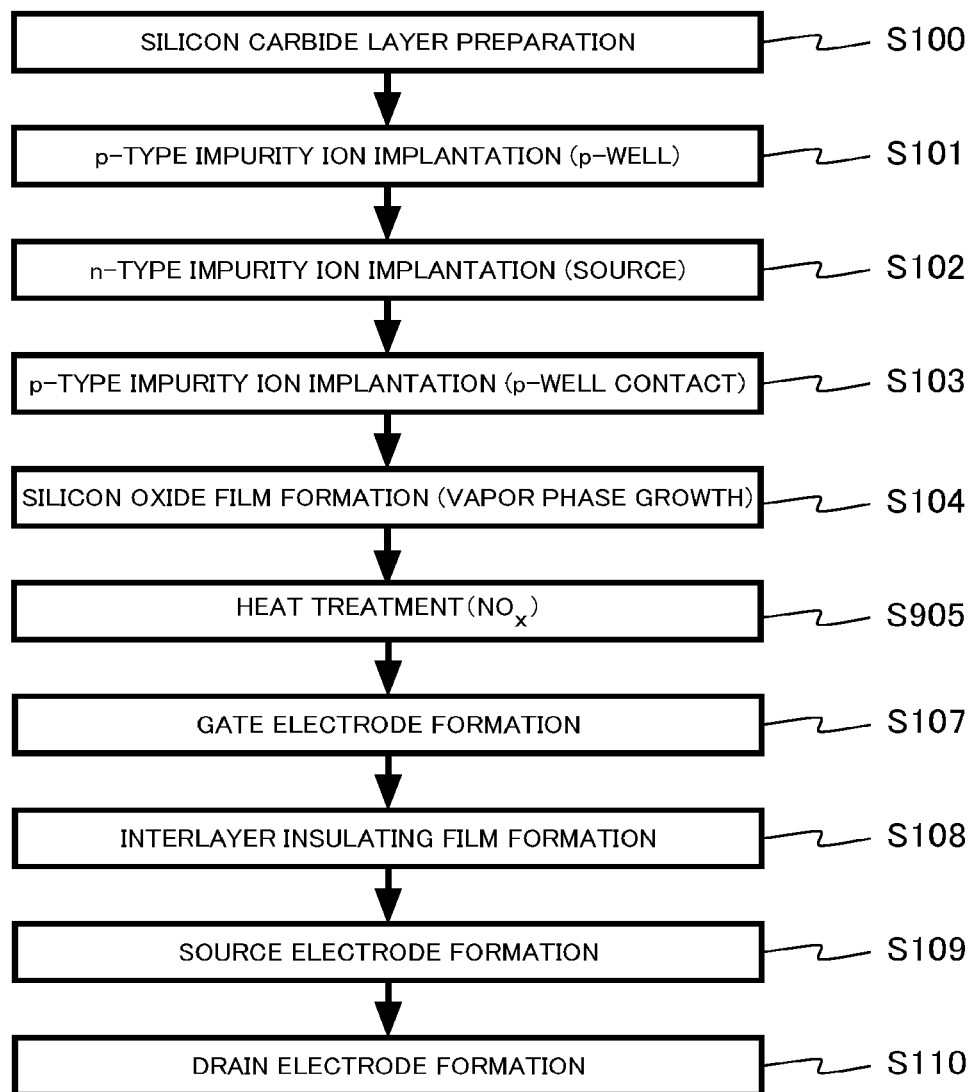
FIG. 7 is a process flow diagram of a method for manufacturing a semiconductor device according to a first comparative example.

FIG. 7 is a process flow diagram of a method for manufacturing a semiconductor device according to a first comparative example. In the method for manufacturing the semiconductor device according to the first comparative example, instead of the first heat treatment (step S105) performed in an atmosphere including ammonia gas ($NH_3$) in the method for manufacturing the semiconductor device according to the first embodiment, heat treatment (step S905) is performed in an atmosphere including nitrogen oxide gas (NOx). Further, the second heat treatment (step S106) performed in the atmosphere including the nitrogen oxide gas (NOx) is not performed. The heat treatment (step S905) is heat treatment of a higher temperature than the second heat treatment (step S106).

In step S905, the heat treatment is performed. The heat treatment is performed in an atmosphere including nitrogen oxide gas (NOx). The nitrogen oxide gas is, for example, nitric monoxide gas (NO). Further, the nitrogen oxide gas is, for example, dinitrogen monoxide gas ($N_2O$).

The temperature of the heat treatment is, for example, equal to or more than 1100° C. and equal to or less than 1450° C.

By the heat treatment in step S905, the interface termination region is formed at the interface between the silicon carbide layer and the silicon oxide film.

Figure 8:
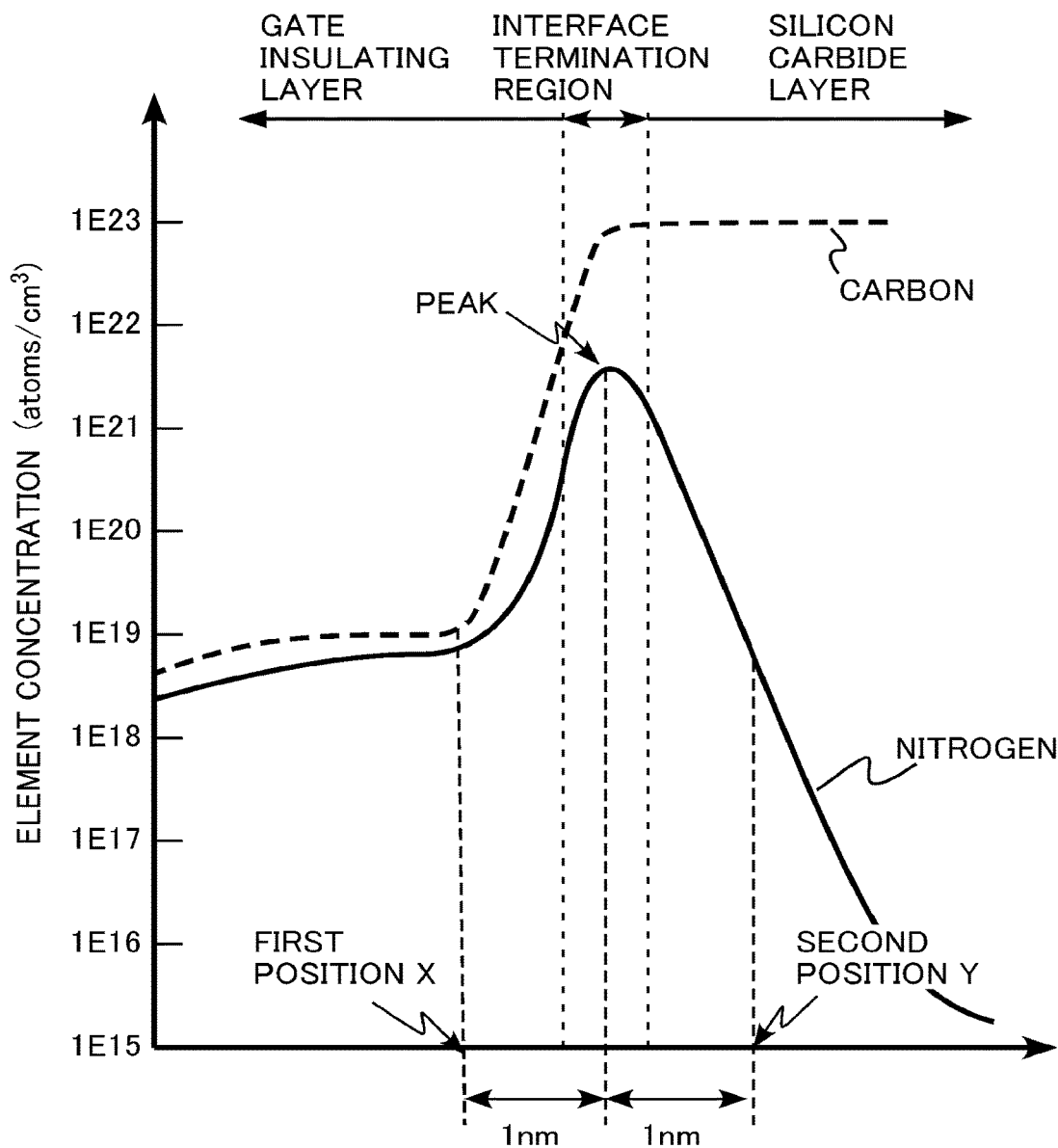
FIG. 8 is a diagram showing an element concentration distribution of the semiconductor device according to the first comparative example.

FIG. 8 is a diagram showing an element concentration distribution of the semiconductor device according to the first comparative example. The semiconductor device according to the first comparative example is a MOSFET manufactured by the manufacturing method shown in FIG. 7.

FIG. 8 is a diagram showing element concentration distributions in the gate insulating layer, the interface termination region, and the silicon carbide layer. FIG. 8 shows concentration distributions of nitrogen and carbon.

The nitrogen concentration distribution has a peak in the interface termination region. The nitrogen concentration at the peak is, for example, equal to or more than $1 \times 10^{21}$ cm$^{-3}$ and less than $1 \times 10^{22}$ cm$^{-3}$. Nitrogen is segregated at the interface between the silicon carbide layer and the gate insulating layer. The amount of nitrogen at the interface termination is insufficient. In the high-temperature treatment with the nitrogen oxide gas in the first comparative example, oxidation and nitridation of the substrate surface occur simultaneously. Since the interface moves to the side of the substrate due to the oxidation, the nitriding amount has an upper limit, and a peak value of the interface nitrogen amount does not reach a required amount and is suppressed to less than $1 \times 10^{22}$ cm$^{-3}$. The upper limit is less than $1 \times 10^{22}$ cm$^{-3}$ regardless of the plane orientation, the amount of nitrogen at the interface termination is insufficient, the interface state remains, and mobility degradation is caused.

The nitrogen concentration at the first position X to be 1 nm away from the peak of the nitrogen concentration distribution to the side of the gate insulating layer is higher than $1\times10^{18}$ cm$^{-3}$. This value is too high as the residual nitrogen concentration in the film.

The nitrogen concentration at the second position Y to be 1 nm away from the peak of the nitrogen concentration distribution to the side of the silicon carbide layer is higher than $1\times10^{10}$ cm$^{-3}$. This value is too high as the nitrogen concentration in the silicon carbide layer.

The carbon concentration distribution decreases from the interface termination region toward the gate insulating layer. The carbon concentration at the first position X is higher than $1\times10^{18}$ cm$^{-3}$. This value is too high as the residual carbon concentration in the film.

The MOSFET according to the first comparative example includes the interface termination region in which nitrogen is segregated. However, the amount of nitrogen does not reach the amount of nitrogen required for the interface termination. Similarly to the MOSFET 100 according to the first embodiment, the decrease in the carrier mobility is suppressed, but the amount of nitrogen is not sufficient.

The MOSFET according to the first comparative example has a higher concentration of carbon or nitrogen in the gate insulating layer than the MOSFET 100 according to the first embodiment. Carbon in the gate insulating layer forms carbon defects. Further, nitrogen in the gate insulating layer forms nitrogen defects. Nitrogen in the gate insulating layer forms, for example, nitrogen defects having C—O—N bonds.

It is considered that carbon in the gate insulating layer is derived from carbon released from the silicon carbide layer, when the surface of the silicon carbide layer is oxidized by the nitrogen oxide gas treatment at the high temperature. Further, it is considered that nitrogen in the nitrogen oxide gas is bonded to carbon released from the silicon carbide layer to form a C—O—N bond, so that nitrogen remains in the gate insulating layer.

Therefore, in the MOSFET according to the first comparative example, due to the residual interface state by the insufficient interface termination and the trap by the carbon defects or the nitrogen defects in the gate insulating layer, the decrease in the carrier mobility, the change in the threshold voltage, the increase in the leakage current of the gate insulating layer, or the decrease in the reliability of the gate insulating layer causes a problem.

Figure 9:
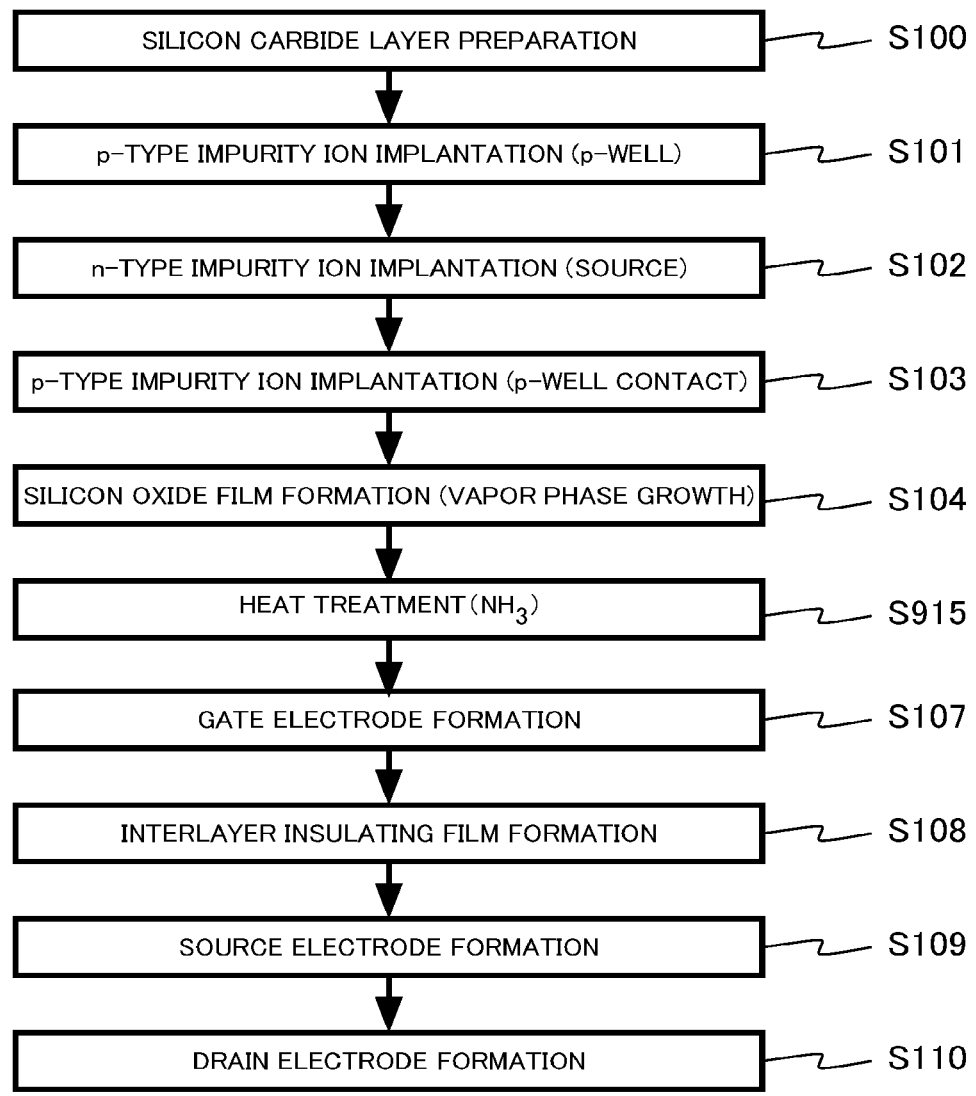
FIG. 9 is a process flow diagram of a method for manufacturing a semiconductor device according to a second comparative example.

FIG. 9 is a process flow diagram of a method for manufacturing a semiconductor device according to a second comparative example. In the method for manufacturing the semiconductor device according to the second comparative example, instead of the heat treatment (step S905) performed in the atmosphere including the nitrogen oxide gas (NOx) in the method for manufacturing the semiconductor device according to the first comparative example, heat treatment (step S915) is performed in an atmosphere including ammonia gas (NH$_3$).

In step S915, the heat treatment is performed. The heat treatment is performed in the atmosphere including the ammonia gas (NH$_3$).

A temperature of the heat treatment is, for example, equal to or more than 1200° C. and equal to or less than 1600° C.

By the heat treatment in step S915, the interface termination region is formed at the interface between the silicon carbide layer and the silicon oxide film.

Figure 10:
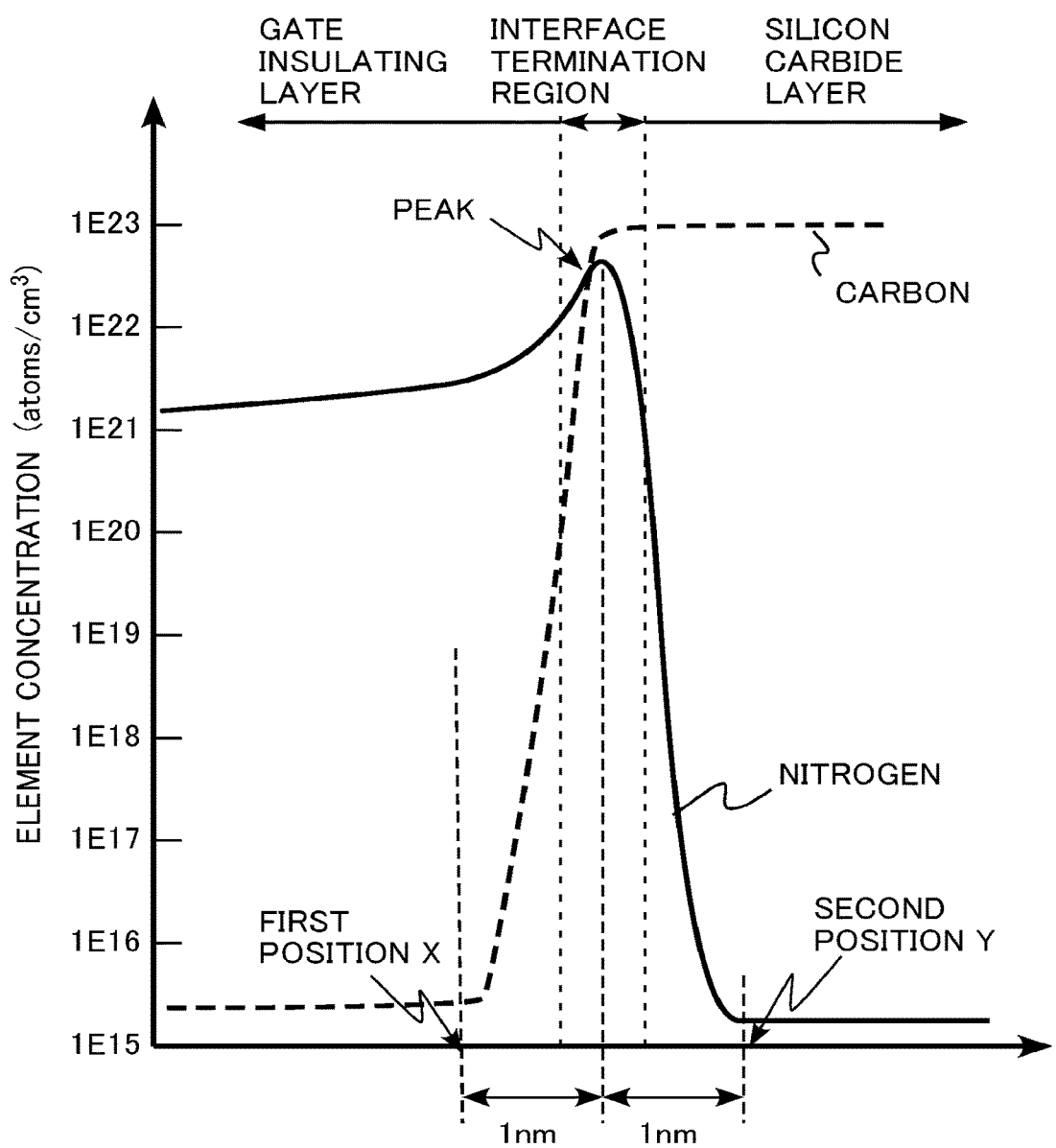
FIG. 10 is a diagram showing an element concentration distribution of the semiconductor device according to the second comparative example.

FIG. 10 is a diagram showing an element concentration distribution of the semiconductor device according to the second comparative example. The semiconductor device according to the second comparative example is a MOSFET manufactured by the manufacturing method shown in FIG. 9.

FIG. 10 is a diagram showing element concentration distributions in the gate insulating layer, the interface termination region, and the silicon carbide layer. FIG. 10 shows concentration distributions of nitrogen and carbon.

The nitrogen concentration distribution has a peak in the interface termination region. A nitrogen concentration at the peak is, for example, equal to or more than $1\times10^{22}$ cm$^{-3}$. Nitrogen is segregated at the interface between the silicon carbide layer and the gate insulating layer. In the high-temperature ammonia (NH$_3$) treatment, a sufficient amount of nitrogen can be introduced at the interface termination. Therefore, in the MOSFET according to the second comparative example, the interface termination is sufficient, and the decrease in the carrier mobility due to the interface state is suppressed as compared with the MOSFET according to the first comparative example.

The nitrogen concentration at the first position X to be 1 nm away from the peak of the nitrogen concentration distribution to the side of the gate insulating layer is higher than $1\times10^{18}$ cm$^{-3}$. This value is too high as the residual nitrogen concentration in the film. In particular, a large amount of nitrogen remains throughout the film, and the nitrogen concentration becomes equal to or more than $1\times10^{21}$ cm$^{-3}$.

The nitrogen concentration at the second position Y to be 1 nm away from the peak of the nitrogen concentration distribution to the side of the silicon carbide layer is lower than $1\times10^{18}$ cm$^{-3}$.

The carbon concentration distribution decreases from the interface termination region toward the gate insulating layer. The carbon concentration at the first position X is lower than $1\times10^{18}$ cm$^{-3}$.

The MOSFET according to the second comparative example includes the interface termination region where nitrogen is introduced at a high concentration. Therefore, similarly to the MOSFET 100 according to the first embodiment, the decrease in the carrier mobility is suppressed.

In the MOSFET according to the second comparative example, the nitrogen concentration in the gate insulating layer is very high as compared with the MOSFET 100 according to the first embodiment. Nitrogen in the gate insulating layer forms the nitrogen defects.

In the method for manufacturing the semiconductor device according to the second comparative example, oxidizing gas is not used for forming the interface termination region. Therefore, the surface of the silicon carbide layer is not oxidized and carbon is not released from the silicon carbide layer. As a result, the carbon concentration in the gate insulating layer is lower than that in the MOSFET according to the first comparative example.

In the MOSFET according to the second comparative example, the carbon defects in the gate insulating layer are reduced as compared with the MOSFET according to the first comparative example. Further, since the carbon concentration in the gate insulating layer is low, the nitrogen defects having C—O—N bonds are also reduced as compared with the MOSFET according to the first comparative example.

Therefore, in the MOSFET according to the second comparative example, the problem of the decrease in the carrier mobility, the change in the threshold voltage, the increase in the leakage current of the gate insulating layer, or the decrease in the reliability of the gate insulating layer due to the carbon defects in the gate insulating layer or the nitrogen defects having the C—O—N bonds is suppressed as compared with the MOSFET according to the first comparative example. However, the problem of the decrease in the carrier mobility, the change in the threshold voltage, the increase in the leakage current of the gate insulating layer, or the decrease in the reliability of the gate insulating layer due to a large amount of nitrogen defects remaining in the gate insulating layer is worsened as compared with the MOSFET according to the first comparative example. This is because a large amount of nitrogen remains in the film.

In the method for manufacturing the semiconductor device according to the second comparative example, oxidizing gas is not used for forming the interface termination region. Therefore, the surface of the silicon carbide layer is not oxidized. By suppressing the oxidation of the surface of the silicon carbide layer 10, the nitrogen concentration in the interface termination region 40 can be increased as compared with the MOSFET according to the first comparative example. Further, by suppressing the oxidation of the surface of the silicon carbide layer 10, it is possible to reduce the nitrogen concentration at the second position Y.

In the MOSFET 100 according to the first embodiment, as shown in FIG. 3, the carbon concentration at the first position X in the gate insulating layer 28 is equal to or less than $1\times10^{18}$ cm$^{-3}$. The carbon concentration at the first position X is preferably equal to or less than $1\times10^{17}$ cm$^{-3}$ and more preferably equal to or less than $1\times10^{16}$ cm$^{-3}$. Further, the nitrogen concentration at the first position X is equal to or less than $1\times10^{18}$ cm$^{-3}$. The nitrogen concentration at the first position X is preferably equal to or less than $1\times10^{1}$ cm$^{-3}$ and more preferably equal to or less than $1\times10^{16}$ cm$^{-3}$.

In the MOSFET 100 according to the first embodiment, as shown in FIG. 3, the concentration of carbon or nitrogen in the gate insulating layer 28 is lower than that in the MOSFET according to the first comparative example. Further, the nitrogen concentration in the gate insulating layer 28 is lower than that in the MOSFET according to the second comparative example. Therefore, the amounts of carbon defects and nitrogen defects having the C—O—N bonds in the gate insulating layer 28 are small.

Therefore, in the MOSFET 100 according to the first embodiment, the decrease in the carrier mobility, the change in the threshold voltage, the increase in the leakage current of the gate insulating layer, or the decrease in the reliability of the gate insulating layer due to the carbon defects and the nitrogen defects in the gate insulating layer is suppressed.

In the MOSFET according to the first comparative example, the interface nitrogen amount is insufficient, and the mobility is lower than that in the first embodiment. Further, since the amount of nitrogen defects or carbon defects is large in the insulating film, the reliability is also lower than that in the first embodiment. That is, in the first comparative example, the interface nitrogen amount is insufficient, and the amounts of nitrogen defects and carbon defects are large in the insulating film.

In the MOSFET according to the second comparative example, the interface nitrogen amount is sufficient, and the mobility becomes the same level as that in the first embodiment. However, since there are a large amount of nitrogen defects in the insulating film, the reliability is significantly lower than that in the first embodiment. Further, the reliability is lower than that in the MOSFET according to the first comparative example. In other words, in the second comparative example, the interface nitrogen amount is sufficient. However, because nitrogen is sufficiently introduced, there is an adverse effect that a large amount of nitrogen defects remain in the film.

In the first embodiment, for example, a process corresponding to the second comparative example is performed to introduce sufficient nitrogen into the interface. Then, a large amount of nitrogen remaining in the insulating film is expelled from the insulating film by oxynitriding treatment at a low temperature at which the interface oxidation does not occur. At that time, if the interface oxidation occurs, the interface nitrogen amount decreases as in the first comparative example, so that it is important to perform the treatment at the temperature at which the interface oxidation does not occur.

The MOSFET 100 according to the first embodiment is manufactured using the manufacturing method according to the first embodiment.

In the manufacturing method according to the first embodiment, after the silicon oxide film is formed in step S104, the first heat treatment is performed in step S105. The first heat treatment is performed in an atmosphere including ammonia gas (NH$_3$).

An element concentration distribution immediately after the interface termination region 40 is formed by the first heat treatment is the same as that of the semiconductor device according to the second comparative example shown in FIG. 10.

Immediately after the first heat treatment in step S105, the nitrogen concentration in the silicon oxide film is high. Nitrogen in the silicon oxide film forms, for example, nitrogen defects including a structure in which a nitrogen atom is bonded to at least two silicon atoms. In the nitrogen defects, the nitrogen atom substitutes the oxygen site of silicon oxide.

In the manufacturing method according to the first embodiment, the second heat treatment is performed in step 106 after the first heat treatment. The second heat treatment is performed in an atmosphere including nitrogen oxide gas (NOx).

The temperature of the second heat treatment is equal to or less than 1050° C. Since the temperature of the second heat treatment is low, the progress of oxidation of the surface of the silicon carbide layer 10 due to the second heat treatment is suppressed. Therefore, the increase in the carbon concentration in the silicon oxide film is suppressed by the second heat treatment. Further, it is possible to suppress occurrence of a situation where nitrogen contributing to the interface termination diffuses into the film and the interface nitrogen amount is reduced. That is, the interface nitrogen amount is maintained.

By including the nitrogen oxide gas (NOx) in the atmosphere of the second heat treatment, the nitrogen defects in the silicon oxide film are reduced. It is considered that the nitrogen atoms substituting the oxygen sites of silicon oxide are substituted by the oxygen atoms of the nitrogen oxide gas (NOx), and the nitrogen atoms become nitrogen gas (N$_2$) and are released from the silicon oxide film.

Therefore, the second heat treatment reduces the nitrogen defects in the silicon oxide film and reduces the nitrogen concentration in the silicon oxide film. Because the nitrogen concentration in the silicon oxide film is high, it may be necessary to perform high temperature and long duration annealing in the second heat treatment. To make the nitrogen concentration at a first position X to be 1 nm away from the peak of the nitrogen concentration distribution to the side of the gate insulating layer 28 equal to or less than $1\times10^{18}$ cm$^{-3}$, at least more than 30 minutes at 950° C. may be required. And to make the nitrogen concentration at a first position X equal to or less than $1\times10^{17}$ cm$^{-3}$, at least more than one hour at 950° C. may be required. And to make the nitrogen concentration at a first position X equal to or less than $1\times10^{16}$ cm$^{-3}$, at least more than two hours at 950° C. may be required.

According to the manufacturing method according to the first embodiment, it is possible to realize the MOSFET 100 in which the interface nitrogen amount is sufficient and the amounts of carbon defects and nitrogen defects in the gate insulating layer 28 are reduced.

From the viewpoint of suppressing the decrease in the carrier mobility of the MOSFET 100, the nitrogen concentration at the peak of the nitrogen concentration distribution in the interface termination region 40 is preferably equal to or more than $1\times10^{22}$ cm$^{-3}$ and more preferably equal to or more than $5\times10^{22}$ cm$^{-3}$.

Further, from the viewpoint of suppressing the decrease in the carrier mobility of the MOSFET 100, the nitrogen concentration at the second position Y to be 1 nm away from the peak of the nitrogen concentration distribution to the side of the silicon carbide layer 10 is preferably equal to or less than $1\times10^{18}$ cm$^{-3}$, more preferably equal to or less than $1\times10^{17}$ cm$^{-3}$, and further preferably equal to or less than $2\times10^{16}$ cm$^{-3}$. Further, from the viewpoint of suppressing the decrease in the carrier mobility of the MOSFET 100, the concentration of the nitrogen atom bonded to the four silicon atoms at the second position Y is preferably equal to or less than $1\times10^{18}$ cm$^{-3}$.

From the viewpoint of increasing the nitrogen concentration in the interface termination region 40, the temperature of the first heat treatment is preferably equal to or more than 1300° C. and more preferably equal to or more than 1400° C.

From the viewpoint of reducing the nitrogen defects in the silicon oxide film, the temperature of the second heat treatment is preferably equal to or more than 800° C., more preferably equal to or more than 850° C., and further preferably equal to or more than 925° C.

From the viewpoint of reducing the nitrogen defects in the silicon oxide film, the nitrogen oxide gas in the second heat treatment is preferably dinitrogen monoxide gas ($N_2O$) having high oxidizing power.

Further, from the viewpoint of suppressing the oxidation of the silicon carbide layer 10, the temperature of the second heat treatment is preferably equal to or less than 1000° C. and is more preferably equal to or less than 950° C.

Even when the first heat treatment is performed in a second atmosphere including nitrogen gas ($N_2$) and hydrogen gas ($H_2$) or a third atmosphere including nitrogen gas ($N_2$) and carbon dioxide gas ($CO_2$), the same functions and effects as those when the first heat treatment is performed in the first atmosphere including the ammonia gas ($NH_3$) can be realized. That is, although the interface nitrogen amount is sufficient, excess nitrogen remains in the insulating film.

In the treatment of each of the first atmosphere including the ammonia gas ($NH_3$), the second atmosphere including the nitrogen gas ($N_2$) and the hydrogen gas ($H_2$), and the third atmosphere including the nitrogen gas ($N_2$) and the carbon dioxide gas ($CO_2$), the interface oxidation does not progress, carbon at the interface can be extracted, and nitrogen can be introduced into the interface. For example, as in the first comparative example, when oxygen is used to extract carbon at the interface, an oxidation reaction and a nitriding reaction compete with each other and the interface moves. For this reason, the interface termination nitrogen amount cannot be sufficiently secured. As in the first embodiment, the interface nitrogen amount can be sufficiently secured by performing the first heat treatment by a method not involving oxidation. On the other hand, in the case of using only the first heat treatment according to the method not involving the oxidation, even if the insulating film is formed later, excess nitrogen remains in the insulating film, which results in causing a problem in the reliability.

From the examination of the inventors, it has become apparent that the treatment with low-temperature oxynitride gas can remove nitrogen in the insulating film with the interface fixed. By performing the first heat treatment by the method not involving the oxidation and then performing the treatment with the low-temperature oxynitride gas, a MOSFET with high mobility and high reliability can be obtained.

In the first comparative example, the treatment of the oxynitride gas is performed at the high temperature for the purpose of interface nitriding. During the treatment, since the interface oxidation occurs, the interface nitrogen amount becomes insufficient. Further, the carbon defects remain in the insulating film, and the C—O—N nitrogen defects and the like remain. As a result, only MOSFETs with low mobility and low reliability are obtained.

As described above, according to the first embodiment, the semiconductor device and the method for manufacturing the semiconductor device in which the interface nitrogen amount is sufficient and the amounts of carbon defects and nitrogen defects in the insulating layer are reduced are realized.

Second Embodiment

A method for manufacturing a semiconductor device according to a second embodiment is different from the method for manufacturing the semiconductor device according to the first embodiment in that a silicon oxide film is formed by thermal oxidation in an atmosphere including oxygen gas and carbon dioxide gas. Hereinafter, description of contents overlapping with those of the first embodiment will be partially omitted.

Figure 11:
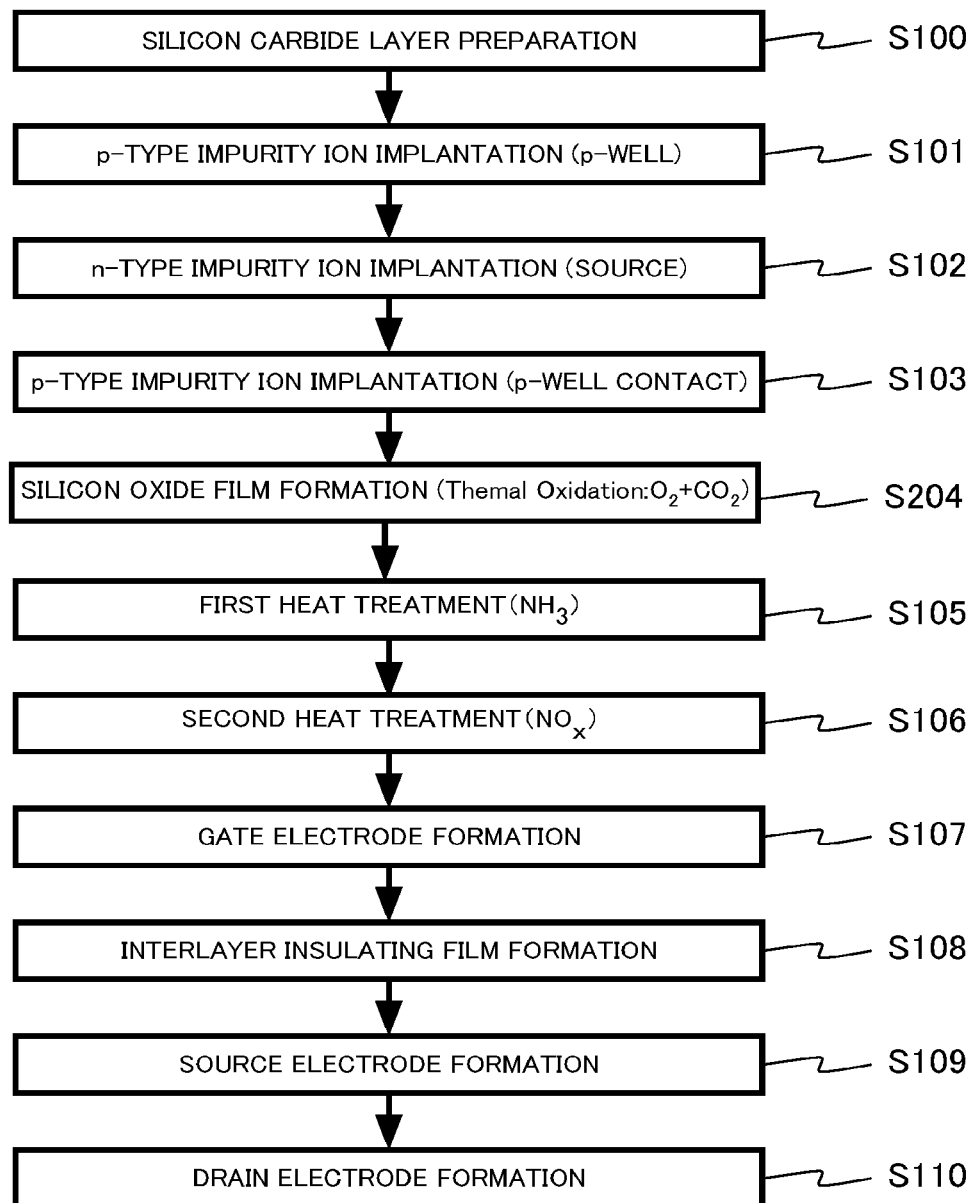
FIG. 11 is a process flow diagram of a method for manufacturing a semiconductor device according to a second embodiment.

FIG. 11 is a process flow diagram of the method for manufacturing the semiconductor device according to the second embodiment. By the method for manufacturing the semiconductor device according to the second embodiment, the MOSFET 100 shown in FIG. 1 is formed. In the method for manufacturing the semiconductor device according to the second embodiment, instead of forming the silicon oxide film by vapor phase growth (step S104) in the method for manufacturing the semiconductor device according to the first embodiment, the silicon oxide film is formed by the thermal oxidation in an atmosphere including oxygen gas and carbon dioxide gas (step S204).

In step S204, the silicon oxide film is formed by the thermal oxidation in an atmosphere including oxygen gas ($O_2$) and carbon dioxide gas ($CO_2$).

For example, the thermal oxidation is performed by supplying the oxygen gas ($O_2$) and the carbon dioxide gas ($CO_2$) to a reaction furnace containing a silicon carbide layer 10.

A temperature of the thermal oxidation is, for example, equal to or more than 1050° C. and equal to or less than 1450° C.

For example, as in the first embodiment, a case where the silicon oxide film is formed by the vapor phase growth is considered. In this case, carbon or nitrogen included in source gas of the vapor phase growth may remain in a gate insulating layer 28. Residual carbon or nitrogen may form carbon defects or nitrogen defects.

In the method for manufacturing the semiconductor device according to the second embodiment, when a silicon carbide layer 10 is thermally oxidized, the carbon dioxide gas is present in the atmosphere, so that a reaction of Formula (1) progresses on a surface of the silicon carbide layer 10.

$$C+CO_2 \rightarrow 2CO \quad (1)$$

The reaction of Formula (1) progresses, so that carbon released by the oxidation of the surface of the silicon carbide layer 10 becomes CO and is removed into the atmosphere. Therefore, an amount of carbon remaining in a gate insulating layer 28 is smaller than that in a case where the carbon dioxide gas is not included in the atmosphere. As a result, the carbon defects in the gate insulating layer 28 are reduced.

Further, the amount of carbon remaining in the gate insulating layer 28 decreases, so that the amount of C—O—N bonds formed in the gate insulating layer 28 also decreases. Therefore, a nitrogen concentration in the gate insulating layer 28 is also reduced. As a result, the nitrogen defects in the gate insulating layer 28 are reduced.

As described above, according to the second embodiment, the semiconductor device and the method for manufacturing the semiconductor device in which the interface nitrogen amount is sufficient and the amounts of carbon defects and nitrogen defects in the insulating layer are reduced are realized.

Third Embodiment

A method for manufacturing a semiconductor device according to a third embodiment is different from the method for manufacturing the semiconductor device according to the first embodiment in that a silicon nitride film is formed on a silicon carbide layer before a silicon oxide film is formed. Hereinafter, description of contents overlapping with those of the first embodiment will be partially omitted.

Figure 12:
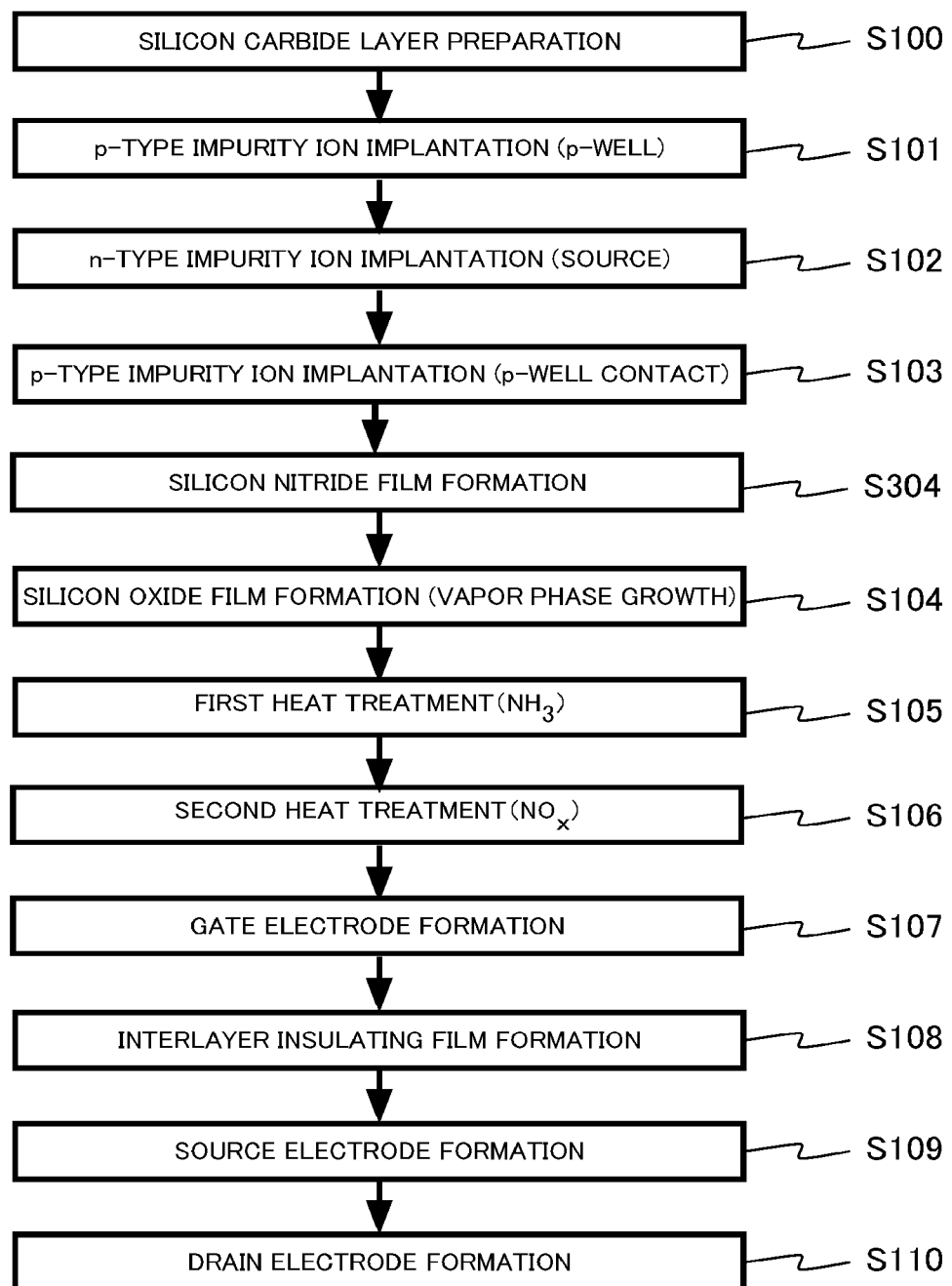
FIG. 12 is a process flow diagram of a method for manufacturing a semiconductor device according to a third embodiment.

FIG. 12 is a process flow diagram of the method for manufacturing the semiconductor device according to the third embodiment. The MOSFET 100 shown in FIG. 1 is formed by the method for manufacturing the semiconductor device according to the third embodiment. In the method for manufacturing the semiconductor device according to the third embodiment, the silicon nitride film is formed (step S304) before the silicon oxide film is formed (step S104).

In step S304, the silicon nitride film is formed on a silicon carbide layer 10. The silicon nitride film is formed by, for example, a CVD method.

A thickness of the silicon nitride film is, for example, equal to or more than 0.5 nm and equal to or less than 3 nm.

By forming the silicon nitride film on the silicon carbide layer 10, a nitrogen concentration in an interface termination region 40 is easily increased.

Note that excess nitrogen released from the silicon nitride film diffuses into the silicon oxide film during first heat treatment (S105) performed in an atmosphere including ammonia gas ($NH_3$). Nitrogen diffused into the silicon oxide film is removed from the silicon oxide film by second heat treatment performed in an atmosphere including nitrogen oxide gas (NOx). Because the nitrogen concentration in the silicon oxide film is low compared to the case of the first embodiment, lower temperature and shorter duration annealing in the second heat treatment may be sufficient. To make the nitrogen concentration at a first position X to be 1 nm away from the peak of the nitrogen concentration distribution to the side of the gate insulating layer 28 equal to or less than $1 \times 10^{18}$ cm$^{-3}$, about 15 minutes at 925° C. may be sufficient. And to make the nitrogen concentration at a first position X equal to or less than $1 \times 10^{17}$ cm$^{-3}$, about 30 minutes at 925° C. may be sufficient. And to make the nitrogen concentration at a first position X equal to or less than $1 \times 10^{16}$ cm$^{-3}$, about one hour at 925° C. may be sufficient.

As described above, according to the third embodiment, the semiconductor device and the method for manufacturing the semiconductor device in which the interface nitrogen amount is sufficient and the amounts of carbon defects and nitrogen defects in an insulating layer are reduced are realized.

Fourth Embodiment

A method for manufacturing a semiconductor device according to a fourth embodiment includes: performing first heat treatment on a silicon carbide layer at a temperature equal to or more than 1200° C. and equal to or less than 1600° C., under at least one atmosphere selected from the group consisting of a first atmosphere including ammonia gas, a second atmosphere including nitrogen gas and hydrogen gas, and a third atmosphere including nitrogen gas and carbon dioxide gas; forming a silicon oxide film on the silicon carbide layer after the first heat treatment; performing second heat treatment in an atmosphere including inert gas after forming the silicon oxide film; and performing third heat treatment at a temperature equal to or more than 750° C. and equal to or less than 1050° C., under an atmosphere including nitrogen oxide gas, after the second heat treatment. The method for manufacturing the semiconductor device according to the fourth embodiment is different from the method for manufacturing the semiconductor device according to the first embodiment in that the first heat treatment is performed before forming the silicon oxide film. Hereinafter, description of contents overlapping with those of the first embodiment will be partially omitted.

Hereinafter, a case where the first heat treatment is performed in the first atmosphere including the ammonia gas will be described as an example.

Figure 13:
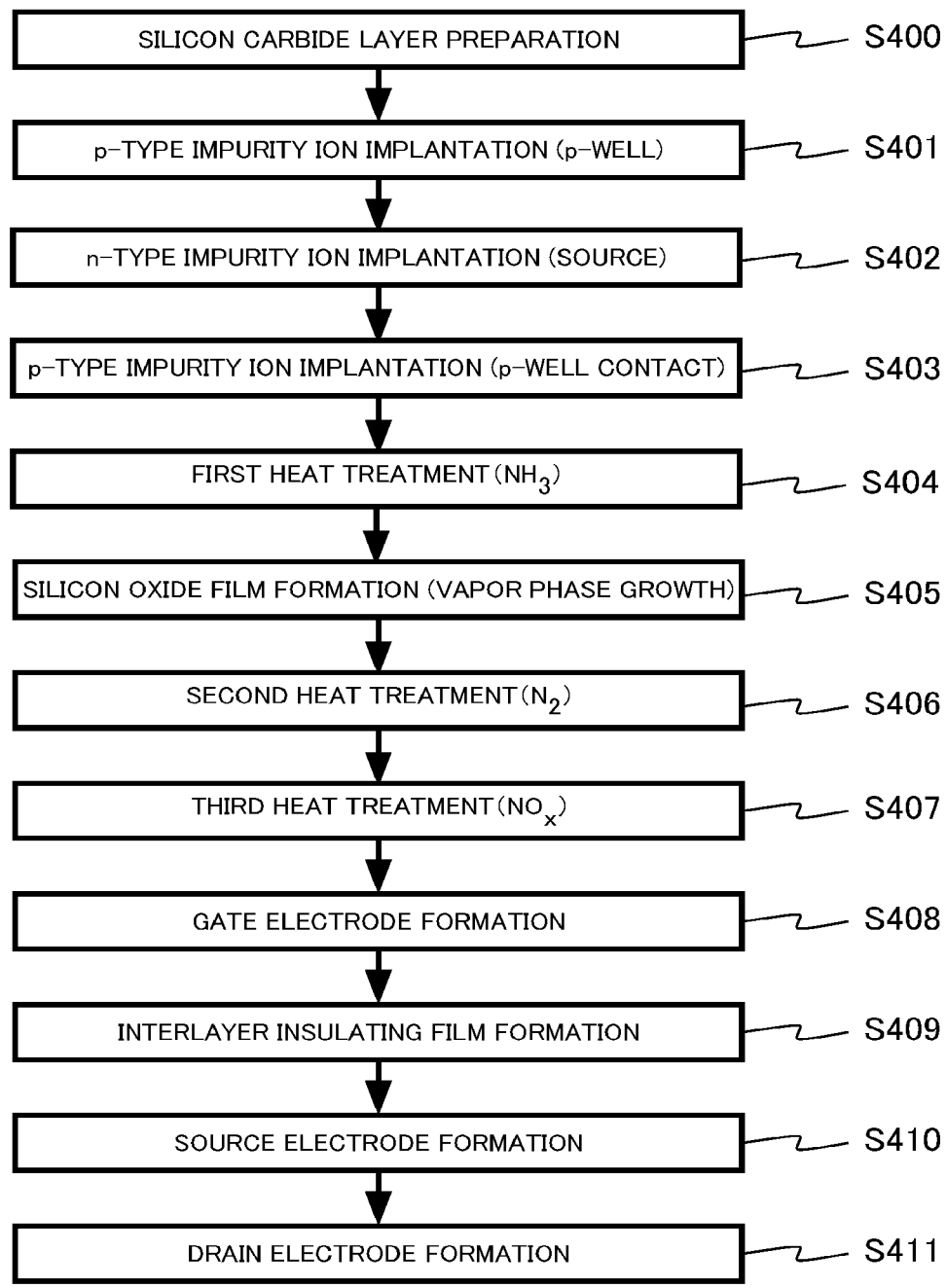
FIG. 13 is a process flow diagram of a method for manufacturing a semiconductor device according to a fourth embodiment.

FIG. 13 is a process flow diagram of the method for manufacturing the semiconductor device according to the fourth embodiment. The MOSFET 100 shown in FIG. 1 is formed by the method for manufacturing the semiconductor device according to the fourth embodiment.

As shown in FIG. 13, the method for manufacturing the semiconductor device according to the fourth embodiment includes silicon carbide layer preparation (step S400), p-type impurity ion implantation (step S401), n-type impurity ion implantation (step S402), p-type impurity ion implantation (step S403), first heat treatment (step S404), silicon oxide film formation (step S405), second heat treatment (step S406), third heat treatment (step S407), gate electrode formation (step S408), interlayer insulating film formation (step S409), source electrode formation (step S410), and drain electrode formation (step S411).

In step S400, a silicon carbide layer 10 is prepared. The silicon carbide layer 10 includes the n$^+$-type drain region 12 and the n$^-$-type drift region 14. The drift region 14 is formed on the drain region 12 by an epitaxial growth method, for example.

The drain region 12 includes nitrogen as n-type impurities. An n-type impurity concentration of the drain region 12 is, for example, equal to or more than $1 \times 10^{18}$ cm$^{-3}$ and equal to or less than $1 \times 10^{21}$ cm$^{-3}$.

The drift region 14 includes nitrogen as n-type impurities. The n-type impurity concentration of the drift region 14 is, for example, equal to or more than $1\times10^{15}$ cm$^{-3}$ and equal to or less than $2\times10^{16}$ cm$^{-3}$. A thickness of the drift region 14 is, for example, equal to or more than 5 μm and equal to or less than 100 μm.

In step S401, first, a first mask material is formed by patterning using photolithography and etching. Then, by using the first mask material as an ion implantation mask, aluminum to be p-type impurities is ion-implanted into the drift region 14. The p-well region 16 is formed by ion implantation.

In step S402, first, a second mask material is formed by patterning using photolithography and etching. Then, by using the second mask material as an ion implantation mask, phosphorus to be n-type impurities is ion-implanted into the drift region 14 to form the source region 18.

In step S403, a third mask material is formed by patterning using photolithography and etching. By using the third mask material as an ion implantation mask, aluminum to be p-type impurities is ion-implanted into the drift region 14 to form the p-well contact region 20.

In step S404, the first heat treatment is performed. The first heat treatment is performed in an atmosphere including ammonia gas (NH$_3$).

For example, the heat treatment is performed by supplying the ammonia gas (NH$_3$) to a reaction furnace containing the silicon carbide layer 10.

A temperature of the first heat treatment is, for example, equal to or more than 1200° C. and equal to or less than 1600° C.

A partial pressure of the ammonia gas in the atmosphere of the first heat treatment is, for example, equal to or more than 90%.

By the first heat treatment, the surface of the silicon carbide layer 10 is nitrided, and an interface termination region 40 is formed on the surface of the silicon carbide layer 10.

In step S405, the silicon oxide film is formed on the silicon carbide layer 10. The silicon oxide film finally becomes the gate insulating layer 28.

The silicon oxide film is formed by vapor phase growth. The silicon oxide film is formed by, for example, a chemical vapor deposition method (CVD method) or a physical vapor deposition method (PVD method). The silicon oxide film is a deposited film. The thickness of the silicon oxide film is, for example, equal to or more than 30 nm and equal to or less than 100 nm. The thickness of the silicon oxide film is, for example, equal to or more than 40 nm and equal to or less than 50 nm.

The silicon oxide film is, for example, a silicon oxide film formed by the CVD method using tetraethyl orthosilicate (TEOS) as source gas. Further, the silicon oxide film is, for example, a silicon oxide film formed by the CVD method using dichlorosilane gas (SiH$_2$Cl$_2$) and dinitrogen monoxide gas (N$_2$O) as source gases.

In step S406, the second heat treatment is performed. The second heat treatment is performed in the atmosphere including the inert gas. The second heat treatment is performed in a non-oxidizing atmosphere in which the surface of silicon carbide layer 10 is not oxidized.

For example, the heat treatment is performed by supplying argon gas (Ar) or nitrogen gas (N$_2$) to the reaction furnace containing the silicon carbide layer 10.

The temperature of the second heat treatment is, for example, equal to or more than 1000° C. and equal to or less than 1400° C.

The second heat treatment also functions as densification annealing of the silicon oxide film. By the second heat treatment, the silicon oxide film becomes a high-density film. Further, by the second heat treatment, excess nitrogen on the surface of the silicon carbide layer 10 diffuses into the silicon oxide film.

In step S407, the third heat treatment is performed. The third heat treatment is performed in an atmosphere including nitrogen oxide gas (NOx). The nitrogen oxide gas is an example of oxidizing gas. The nitrogen oxide gas is, for example, nitric monoxide gas (NO). Further, the nitrogen oxide gas is, for example, dinitrogen monoxide gas (N$_2$O).

For example, the heat treatment is performed by supplying the nitrogen oxide gas (NOx) to the reaction furnace containing the silicon carbide layer 10.

The temperature of the third heat treatment is, for example, equal to or more than 750° C. and equal to or less than 1050° C. The temperature of the third heat treatment is lower than the temperature of the first heat treatment.

A partial pressure of the nitrogen oxide gas in the atmosphere of the third heat treatment is, for example, equal to or more than 10%.

By the third heat treatment, nitrogen in the silicon oxide film is removed. By the third heat treatment, the silicon oxide film with reduced nitrogen defects is formed.

In step S408, a gate electrode 30 is formed on the gate insulating layer 28. The gate electrode 30 is, for example, polycrystalline silicon including n-type impurities or p-type impurities.

In step S409, an interlayer insulating film 32 is formed on the gate electrode 30. The interlayer insulating film 32 is, for example, a silicon oxide film.

In step S410, a source electrode 34 is formed. The source electrode 34 is formed on the source region 18 and the p-well contact region 20. The source electrode 34 is formed by sputtering of nickel (Ni) and aluminum (Al), for example.

In step S411, a drain electrode 36 is formed. The drain electrode 36 is formed on the back side of the silicon carbide layer 10. The drain electrode 36 is formed by sputtering of nickel, for example.

The MOSFET 100 shown in FIG. 1 is formed by the above manufacturing method.

As described above, according to the fourth embodiment, the semiconductor device and the method for manufacturing the semiconductor device in which the interface nitrogen amount is sufficient and the amounts of carbon defects and nitrogen defects in the insulating layer are reduced are realized.

Fifth Embodiment

A method for manufacturing a semiconductor device according to a fifth embodiment is different from the method for manufacturing the semiconductor device according to the fourth embodiment in that a silicon nitride film is formed on a silicon carbide layer before first heat treatment. Hereinafter, description of contents overlapping with those of the fourth embodiment will be partially omitted.

Figure 14:
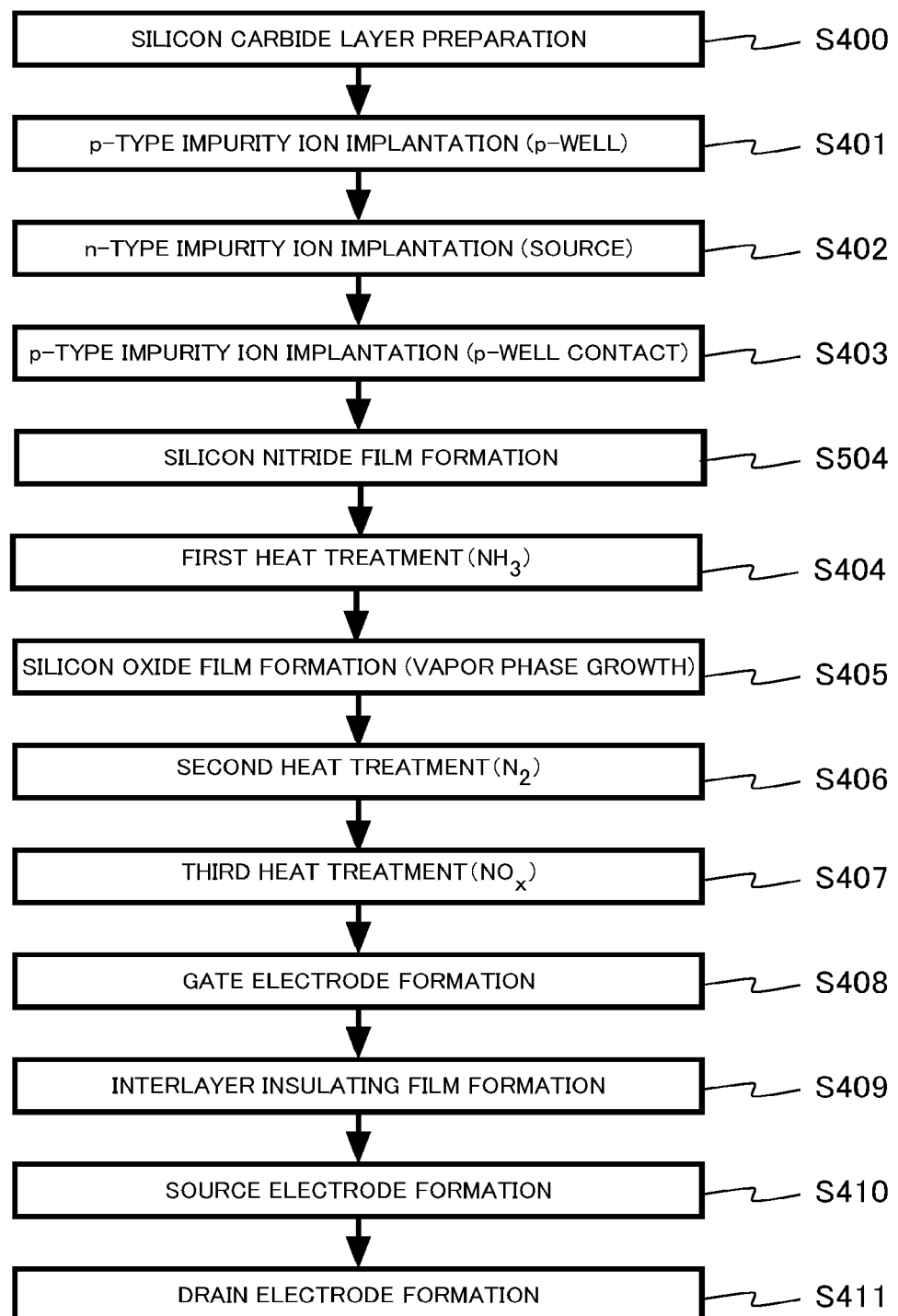
FIG. 14 is a process flow diagram of a method for manufacturing a semiconductor device according to a fifth embodiment.

FIG. 14 is a process flow diagram of the method for manufacturing the semiconductor device according to the fifth embodiment. The MOSFET 100 shown in FIG. 1 is formed by the method for manufacturing the semiconductor device according to the fifth embodiment. In the method for manufacturing the semiconductor device according to the fifth embodiment, before the first heat treatment (step S404) performed in an atmosphere including ammonia gas (NH$_3$), the silicon nitride film is formed (step S504).

In step S504, the silicon nitride film is formed on the silicon carbide layer 10. The silicon nitride film is formed by, for example, a CVD method.

A thickness of the silicon nitride film is, for example, equal to or more than 0.5 nm and equal to or less than 3 nm.

By forming the silicon nitride film on the silicon carbide layer 10 before the first heat treatment, a nitrogen concentration in an interface termination region 40 is easily increased.

Note that excess nitrogen released from the silicon nitride film diffuses into the silicon oxide film during second heat treatment (step S406) performed in an atmosphere including inert gas. Nitrogen diffused in the silicon oxide film is removed from the silicon oxide film by third heat treatment (step S407) performed in an atmosphere including nitrogen oxide gas (NOx).

As described above, according to the fifth embodiment, the semiconductor device and the method for manufacturing the semiconductor device in which the interface nitrogen amount is sufficient and the amounts of carbon defects and nitrogen defects in the insulating layer are reduced are realized.

Sixth Embodiment

A semiconductor device according to a sixth embodiment is different from the semiconductor device according to the first embodiment in that the semiconductor device is a trench gate type MOSFET including a gate electrode in a trench. Hereinafter, description of contents overlapping with those of the first embodiment will be partially omitted.

Figure 15:
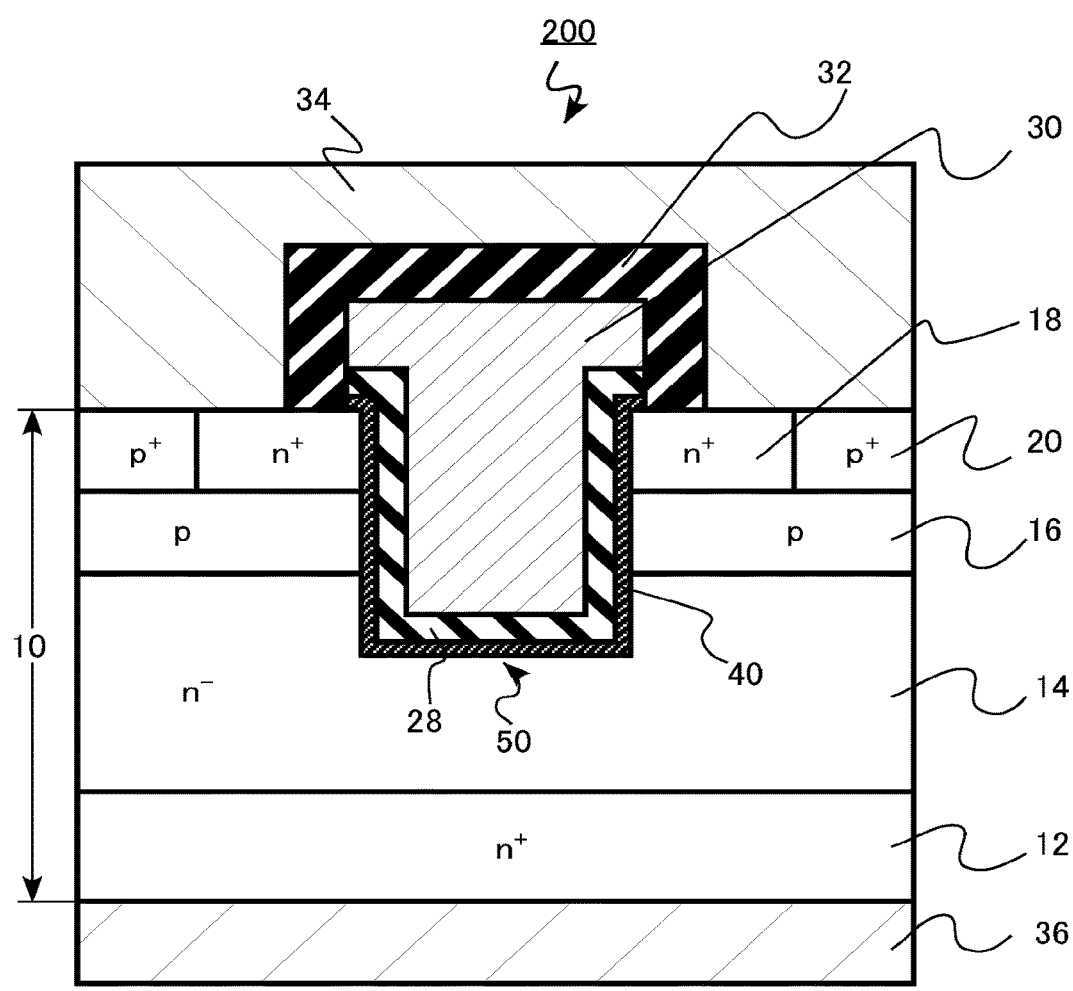
FIG. 15 is a schematic cross-sectional view of a semiconductor device according to a sixth embodiment.

FIG. 15 is a schematic cross-sectional view of the semiconductor device according to the sixth embodiment. The semiconductor device according to the sixth embodiment is a MOSFET 200. The MOSFET 200 is a trench gate type MOSFET including a gate electrode in a trench. Further, the MOSFET 200 is an n-channel MOSFET using electrons as carriers.

The MOSFET 200 includes a silicon carbide layer 10, a gate insulating layer 28 (silicon oxide layer), a gate electrode 30, an interlayer insulating film 32, a source electrode 34, a drain electrode 36, an interface termination region 40 (region), and a trench 50.

The silicon carbide layer 10 includes a drain region 12, a drift region 14, a p-well region 16, a source region 18, and a p-well contact region 20.

The trench 50 penetrates the source region 18 and the p-well region 16 and reaches the drift region 14. A bottom surface of the trench 50 is disposed in the drift region 14.

In the trench 50, the gate insulating layer 28 and the gate electrode 30 are provided. Side surfaces of the trench 50 are, for example, surfaces having off angles equal to or more than 0 degrees and equal to or less than 8 degrees with respect to an m face.

As described above, according to the sixth embodiment, the semiconductor device in which the interface nitrogen amount is sufficient and the amounts of carbon defects and nitrogen defects in the gate insulating layer 28 are reduced can be realized. Further, since the trench gate type is used, a channel density per unit area of a chip is increased, and on-resistance of the MOSFET is reduced.

Seventh Embodiment

A semiconductor device according to a seventh embodiment is different from the semiconductor device according to the first embodiment in that a gate insulating layer is present in a termination region of a MOSFET. Hereinafter, description of contents overlapping with those of the first embodiment will be partially omitted.

Figure 16:
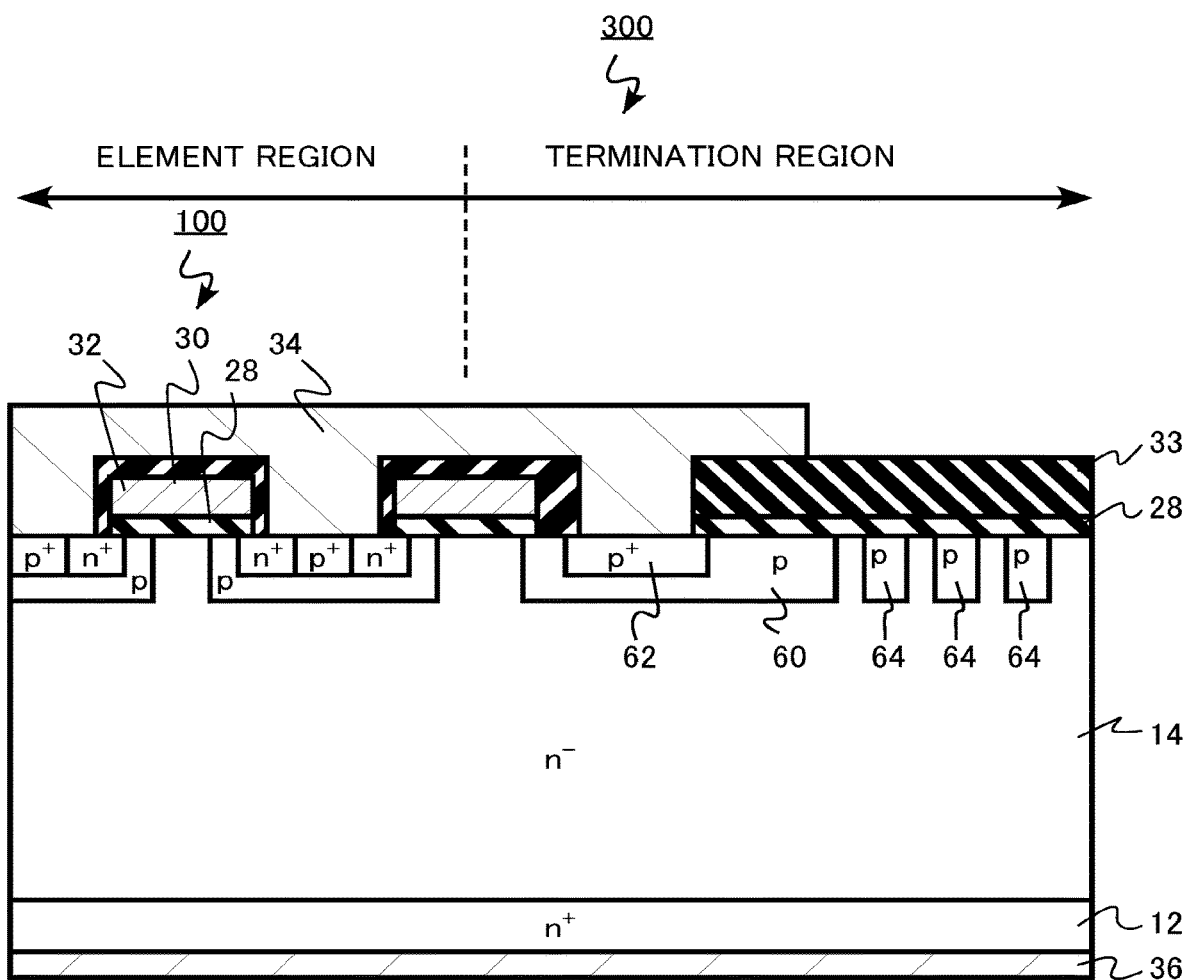
FIG. 16 is a schematic cross-sectional view of a semiconductor device according to a seventh embodiment.

FIG. 16 is a schematic cross-sectional view of the semiconductor device according to the seventh embodiment. The semiconductor device according to the seventh embodiment is a MOSFET 300. The MOSFET 300 includes an element region and a termination region provided around the element region. The termination region has a function of improving a breakdown voltage of the MOSFET 300.

In the element region, for example, the MOSFET 100 according to the first embodiment is disposed as a unit cell.

The termination region includes a p-type RESURF region 60, a $p^+$-type contact region 62, p-type guard ring regions 64, a gate insulating layer 28 (silicon oxide layer), and a field oxide film 33.

A configuration of the gate insulating layer 28 is the same as that of the MOSFET 100 according to the first embodiment.

The field oxide film 33 is, for example, a silicon oxide film.

An interface termination region including nitrogen (not shown) is provided between a silicon carbide layer 10 and the gate insulating layer 28.

When the MOSFET 300 is turned off, a depletion layer is formed in the RESURF region 60, the guard ring regions 64, and a drift region 14 between the guard ring regions 64, so that a breakdown voltage of the MOSFET 300 is improved.

However, when there is a trap level due to carbon defects or nitrogen defects in the gate insulating layer 28, the charges are trapped in an energy level. By an electric field of the trapped charges, a desired depletion layer may not be formed. In this case, the breakdown voltage of the MOSFET 300 is degraded.

According to the seventh embodiment, the interface nitrogen amount is sufficient and the amounts of carbon defects and nitrogen defects in the gate insulating layer 28 are reduced. Therefore, the trap level in the gate insulating layer 28 is reduced. As a result, a desired depletion layer is formed and a MOSFET having a stable breakdown voltage is realized.

Eighth Embodiment

An inverter circuit and a drive device according to an eighth embodiment are an inverter circuit and a drive device including the semiconductor device according to the first embodiment.

Figure 17:
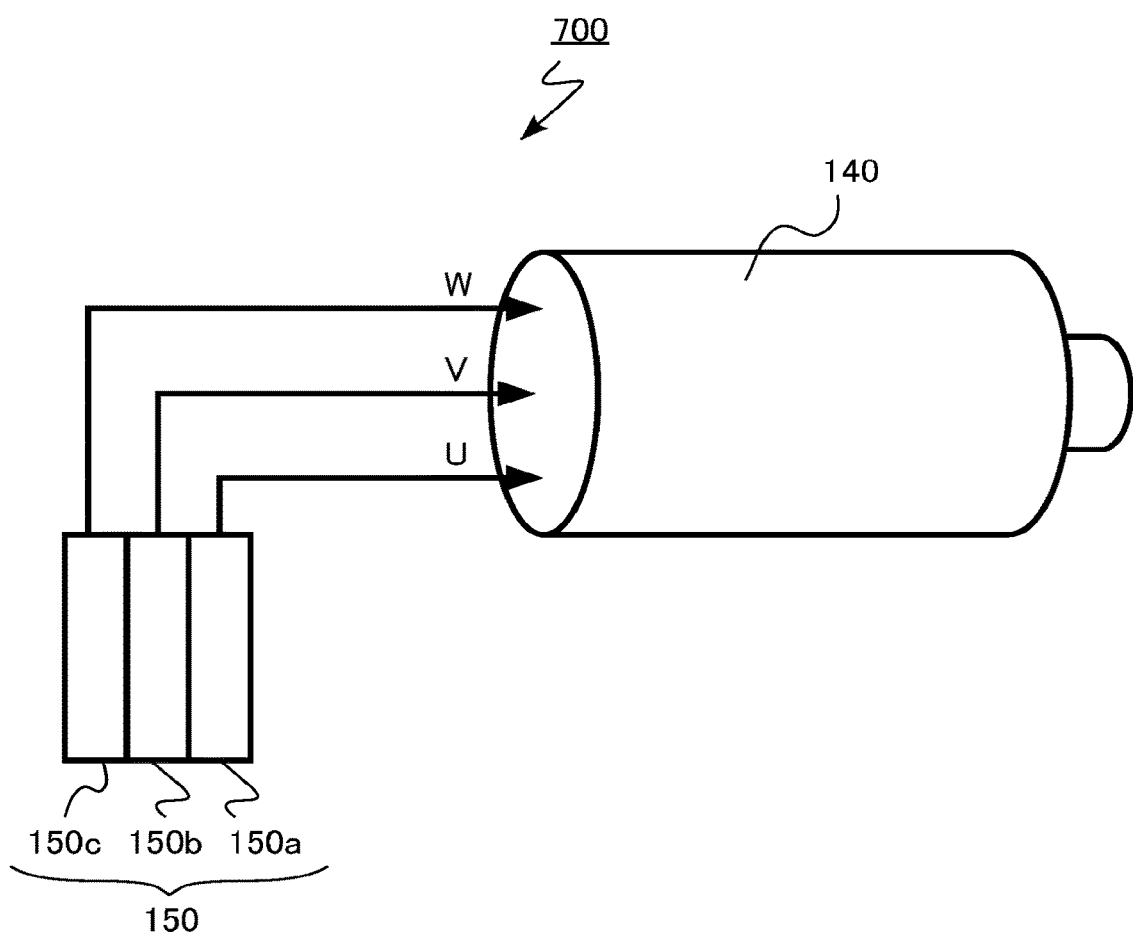
FIG. 17 is a schematic diagram of a drive device according to an eighth embodiment.

FIG. 17 is a schematic diagram of the drive device according to the eighth embodiment. A drive device 700 includes a motor 140 and an inverter circuit 150.

The inverter circuit 150 includes three semiconductor modules 150a, 150b, and 150c using the MOSFET 100 according to the first embodiment as a switching element. By connecting the three semiconductor modules 150a, 150b, and 150c in parallel, the three-phase inverter circuit 150 including three AC voltage output terminals U, V, and W is realized. The motor 140 is driven by an AC voltage output from the inverter circuit 150.

According to the eighth embodiment, characteristics of the inverter circuit 150 and the drive device 700 are improved by including the MOSFET 100 having improved characteristics.

Ninth Embodiment

A vehicle according to a ninth embodiment is a vehicle including the semiconductor device according to the first embodiment.

Figure 18:
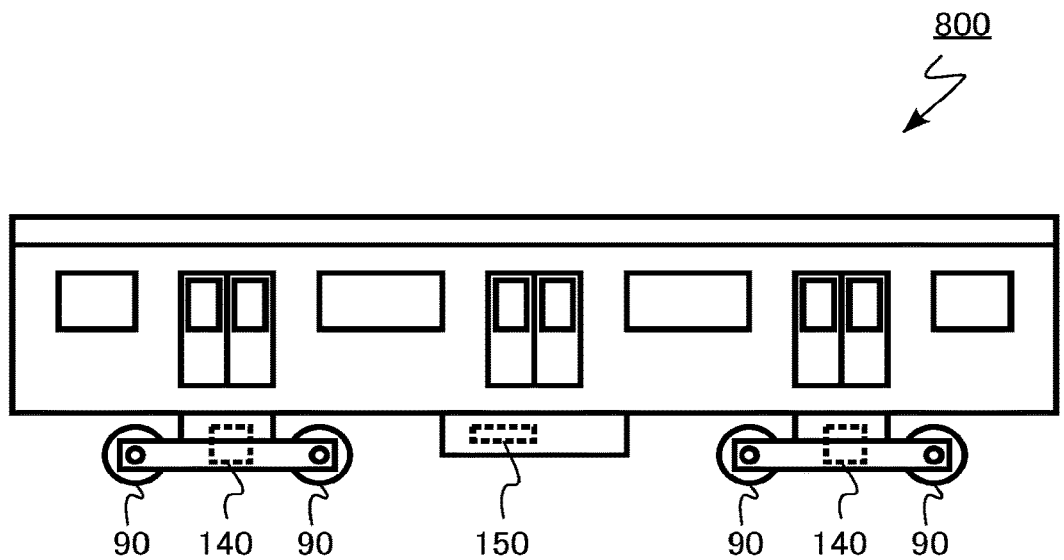
FIG. 18 is a schematic diagram of a vehicle according to a ninth embodiment.

FIG. 18 is a schematic diagram of the vehicle according to the ninth embodiment. A vehicle 800 according to the ninth embodiment is a railroad vehicle. The vehicle 800 includes motors 140 and an inverter circuit 150.

The inverter circuit 150 includes three semiconductor modules using the MOSFET 100 according to the first embodiment as a switching element. By connecting the three semiconductor modules in parallel, the three-phase inverter circuit 150 including three AC voltage output terminals U, V, and W is realized. The motor 140 is driven by an AC voltage output from the inverter circuit 150. Wheels 90 of the vehicle 800 are rotated by the motor 140.

According to the ninth embodiment, characteristics of the vehicle 800 are improved by including the MOSFET 100 having improved characteristics.

Tenth Embodiment

A vehicle according to a tenth embodiment is a vehicle including the semiconductor device according to the first embodiment.

Figure 19:
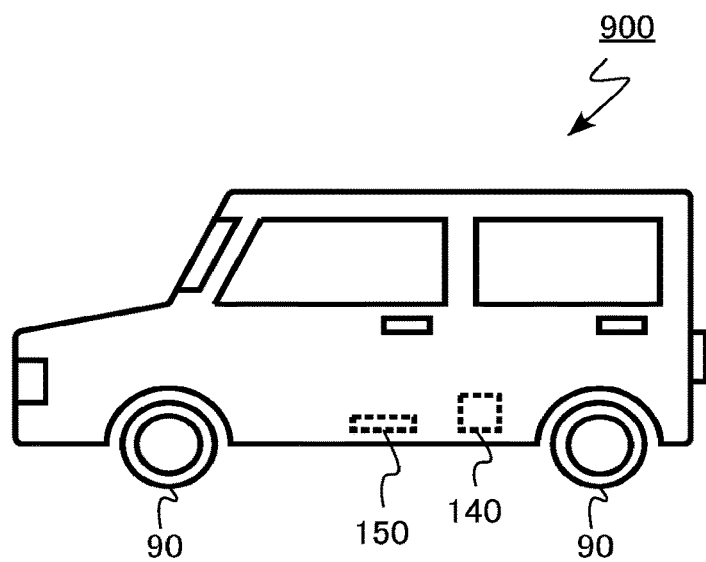
FIG. 19 is a schematic diagram of a vehicle according to a tenth embodiment.

FIG. 19 is a schematic diagram of the vehicle according to the tenth embodiment. A vehicle 900 according to the tenth embodiment is an automobile. The vehicle 900 includes a motor 140 and an inverter circuit 150.

The inverter circuit 150 includes three semiconductor modules using the MOSFET 100 according to the first embodiment as a switching element. By connecting the three semiconductor modules in parallel, the three-phase inverter circuit 150 including three AC voltage output terminals U, V, and W is realized.

The motor 140 is driven by an AC voltage output from the inverter circuit 150. Wheels 90 of the vehicle 900 are rotated by the motor 140.

According to the tenth embodiment, characteristics of the vehicle 900 are improved by including the MOSFET 100 having improved characteristics.

Eleventh Embodiment

An elevator according to an eleventh embodiment is an elevator including the semiconductor device according to the first embodiment.

Figure 20:
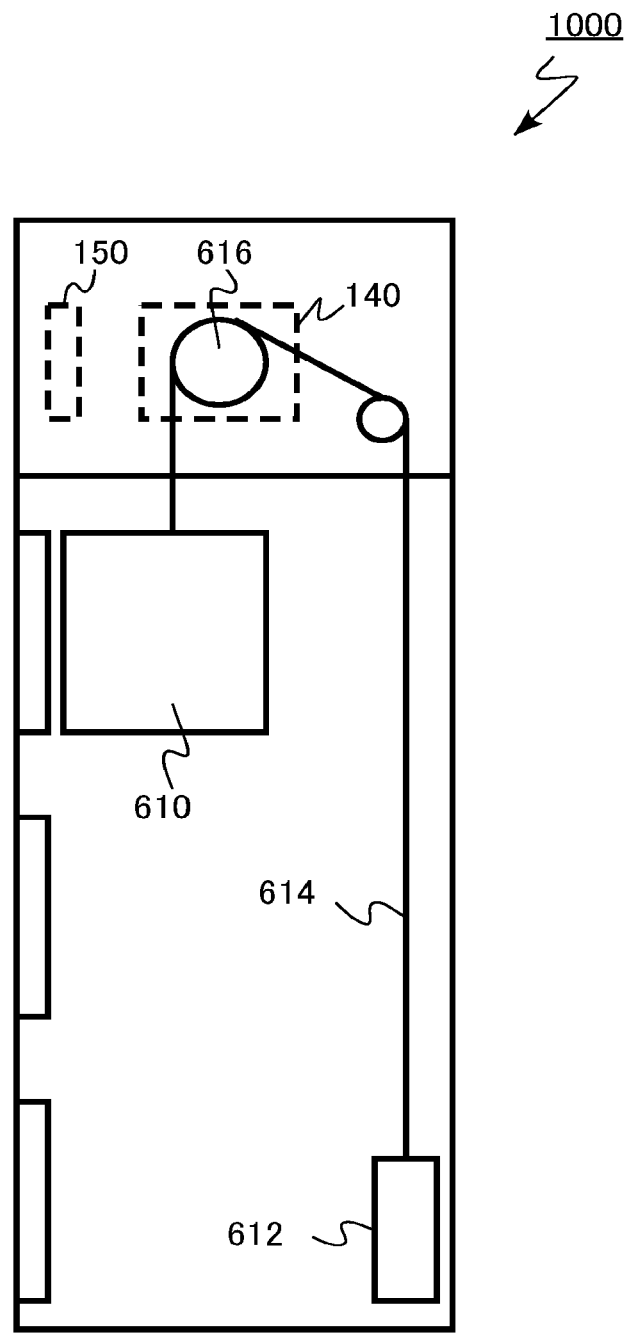
FIG. 20 is a schematic diagram of an elevator according to an eleventh embodiment.

FIG. 20 is a schematic diagram of the elevator according to the eleventh embodiment. An elevator 1000 according to the eleventh embodiment includes a car 610, a counter weight 612, a wire rope 614, a winding machine 616, a motor 140, and an inverter circuit 150.

The inverter circuit 150 includes three semiconductor modules using the MOSFET 100 according to the first embodiment as a switching element. By connecting the three semiconductor modules in parallel, the three-phase inverter circuit 150 including three AC voltage output terminals U, V, and W is realized.

The motor 140 is driven by an AC voltage output from the inverter circuit 150. The winding machine 616 is rotated by the motor 140 and the car 610 is elevated.

According to the eleventh embodiment, characteristics of the elevator 1000 are improved by including the MOSFET 100 having improved characteristics.

As described above, in the first to seventh embodiments, the case where 4H—SiC is used as the crystal structure of silicon carbide has been described as an example. However, the present disclosure can be applied to silicon carbide of other crystal structure such as 6H—SiC and 3C—SiC.

Further, in the first to seventh embodiments, the case where the gate insulating layer 28 is provided on the silicon face or the m face of the silicon carbide layer has been described as an example. However, the present disclosure can be applied to a case where the gate insulating layer 28 is provided on other face of the silicon carbide layer, for example, a carbon face, an a face, a (0-33-8) face, or the like.

An oxidation rate of the silicon carbide layer depends on the plane orientation. In the first to seventh embodiments, it is preferable to optimize the temperature of the first heat treatment according to the plane orientation.

Further, the present disclosure can be applied to an n-channel insulated gate bipolar transistor (IGBT).

Further, the present disclosure can be applied to a p-channel MOSFET or IGBT, in addition to the n-channel MOSFET or IGBT.

Further, in the eighth to eleventh embodiments, the case where the semiconductor device according to the present disclosure is applied to the vehicle or the elevator has been described as an example. However, the semiconductor device according to the present disclosure can be applied to a power conditioner of a photovoltaic power generation system and the like, for example.

Further, in the eighth to eleventh embodiments, the case where the semiconductor device according to the first embodiment is applied has been described as an example. However, the semiconductor device according to any one of the second to seventh embodiments can be applied.

While certain embodiments have been described, these embodiments have been presented by way of example only, and are not intended to limit the scope of the inventions. Indeed, the semiconductor device, the method for manufacturing the semiconductor device, the inverter circuit, the drive device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
    performing first heat treatment on a silicon carbide layer at a temperature equal to or more than 1200° C. and equal to or less than 1600° C., under at least one atmosphere selected from the group consisting of a first atmosphere including ammonia gas, a second atmosphere including nitrogen gas and hydrogen gas, and a third atmosphere including nitrogen gas and carbon dioxide gas;
    forming a silicon oxide film on the silicon carbide layer after the first heat treatment;
    performing second heat treatment in an atmosphere including inert gas after the forming the silicon oxide film; and
    performing third heat treatment at a temperature equal to or more than 750° C. and equal to or less than 1050° C., under an atmosphere including nitrogen oxide gas, after the performing the second heat treatment.

2. The method according to claim 1, wherein the second heat treatment is performed at a temperature equal to or more than 1000° C. and equal to or less than 1400° C.

3. The method according to claim 1, further comprising: forming a silicon nitride film on the silicon carbide layer before the performing the first heat treatment.

4. The method according to claim 1, wherein a thickness of the silicon oxide film is equal to or more than 30 nm and equal to or less than 100 nm.

5. The method according to claim 1, further comprising: forming a gate electrode on the silicon oxide film.

\* \* \* \* \*